(12) United States Patent  
Govil

(10) Patent No.: US 8,395,371 B2  
(45) Date of Patent: Mar. 12, 2013

(54) METHODS FOR CHARACTERIZING THE BEHAVIOR OF MICROELECTROMECHANICAL SYSTEM DEVICES

(75) Inventor: Alok Govil, Santa Clara, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 1053 days.

(21) Appl. No.: 12/242,790

(22) Filed: Sep. 30, 2008

(65) Prior Publication Data

US 2009/0201009 A1    Aug. 13, 2009

Related U.S. Application Data

(60) Provisional application No. 61/027,781, filed on Feb. 11, 2008.

(51) Int. Cl.  
*G01R 23/02* (2006.01)  
*G01R 27/08* (2006.01)

(52) U.S. Cl. ..................... 324/76.39; 324/713

(58) Field of Classification Search .......... 324/252, 324/244, 260, 76.39, 713  
See application file for complete search history.

(56) References Cited

U.S. PATENT DOCUMENTS

| | | |
|---|---|---|
| 5,559,358 A | 9/1996 | Burns et al. |
| 5,729,075 A | 3/1998 | Strain |
| 5,835,255 A | 11/1998 | Miles |
| 5,835,256 A | 11/1998 | Huibers |
| 5,905,489 A | 5/1999 | Takahama et al. |
| 5,990,473 A | 11/1999 | Dickey et al. |
| 6,040,937 A | 3/2000 | Miles |
| 6,077,452 A | 6/2000 | Litvak |
| 6,160,541 A | 12/2000 | Palalau et al. |
| 6,275,326 B1 | 8/2001 | Bhalla et al. |
| 6,285,207 B1 | 9/2001 | Listwan |
| 6,509,620 B2 | 1/2003 | Hartwell et al. |
| 6,526,829 B1 | 3/2003 | Lysen et al. |
| 6,529,654 B1 | 3/2003 | Wong et al. |
| 6,567,715 B1 | 5/2003 | Sinclair et al. |
| 6,630,834 B2 | 10/2003 | Min et al. |
| 6,657,218 B2 | 12/2003 | Noda |
| 6,674,562 B1 | 1/2004 | Miles |
| 6,734,977 B2 | 5/2004 | Noda |
| 6,771,851 B1 | 8/2004 | Yang |
| 6,781,702 B2 | 8/2004 | Giannakopoulos et al. |
| 6,845,190 B1 | 1/2005 | Smithwick et al. |

(Continued)

FOREIGN PATENT DOCUMENTS

| | | |
|---|---|---|
| EP | 1 004 910 | 5/2000 |
| EP | 1 630 779 | 3/2006 |

(Continued)

OTHER PUBLICATIONS

Office Action dated Dec. 29, 2011 in U.S. Appl. No. 12/242,763.

(Continued)

*Primary Examiner* — Jay Patidar  
(74) *Attorney, Agent, or Firm* — Knobbe Martens Olson & Bear LLP

(57) ABSTRACT

Various methods are described to characterize interferometric modulators or similar devices. Measured voltages across interferometric modulators may be used to characterize transition voltages of the interferometric modulators. Measured currents may be analyzed by integration of measured current to provide an indication of a dynamic response of the interferometric modulator. Frequency analysis may be used to provide an indication of a hysteresis window of the interferometric modulator or mechanical properties of the interferometric modulator. Capacitance may be determined through signal correlation, and spread-spectrum analysis may be used to minimize the effect of noise or interference on measurements of various interferometric modulator parameters.

8 Claims, 33 Drawing Sheets

U.S. PATENT DOCUMENTS

| | | | |
|---|---|---|---|
| 6,950,193 | B1 | 9/2005 | Discenzo |
| 6,998,851 | B2 | 2/2006 | van Spengen |
| 7,026,821 | B2 | 4/2006 | Martin |
| 7,075,700 | B2 | 7/2006 | Muenter |
| 7,123,216 | B1 | 10/2006 | Miles |
| 7,126,741 | B2 | 10/2006 | Wagner et al. |
| 7,218,172 | B2 | 5/2007 | Blodgett |
| 7,327,510 | B2 | 2/2008 | Cummings et al. |
| 7,339,384 | B2 | 3/2008 | Peng et al. |
| 7,355,936 | B2 | 4/2008 | Senshu |
| 7,412,775 | B1 | 8/2008 | Karnick et al. |
| 7,423,287 | B1 | 9/2008 | U'Ren et al. |
| 7,453,579 | B2 | 11/2008 | Kothari et al. |
| 7,525,730 | B2 | 4/2009 | Floyd |
| 7,551,159 | B2 | 6/2009 | Mignard et al. |
| 7,580,176 | B2 | 8/2009 | Cummings et al. |
| 7,586,602 | B2 | 9/2009 | Maity et al. |
| 2002/0050960 | A1 | 5/2002 | Setoguchi et al. |
| 2002/0075555 | A1 | 6/2002 | Miles |
| 2002/0174720 | A1 | 11/2002 | Cardarelli |
| 2003/0080811 | A1 | 5/2003 | Nakatani et al. |
| 2003/0102858 | A1 | 6/2003 | Jacobson et al. |
| 2004/0042000 | A1 | 3/2004 | Mehrl et al. |
| 2004/0218341 | A1 | 11/2004 | Martin et al. |
| 2004/0223204 | A1 | 11/2004 | Mao et al. |
| 2005/0030551 | A1 | 2/2005 | Rosakis et al. |
| 2005/0042777 | A1 | 2/2005 | Boger et al. |
| 2005/0206991 | A1 | 9/2005 | Chui et al. |
| 2005/0237276 | A1 | 10/2005 | Tsuchida et al. |
| 2005/0242904 | A1 | 11/2005 | Lutz et al. |
| 2005/0286111 | A1 | 12/2005 | Muenter |
| 2006/0044298 | A1 | 3/2006 | Mignard et al. |
| 2006/0044928 | A1 | 3/2006 | Chui et al. |
| 2006/0050350 | A1 | 3/2006 | Rijks et al. |
| 2006/0066863 | A1 | 3/2006 | Cummings et al. |
| 2006/0067653 | A1 | 3/2006 | Gally et al. |
| 2006/0077401 | A1 | 4/2006 | Kothari et al. |
| 2006/0103643 | A1 | 5/2006 | Mathew et al. |
| 2006/0114243 | A1 | 6/2006 | Iwasaki |
| 2006/0243023 | A1 | 11/2006 | Wong |
| 2007/0053652 | A1 | 3/2007 | Mignard et al. |
| 2007/0075942 | A1 | 4/2007 | Martin et al. |
| 2007/0080695 | A1 | 4/2007 | Morrell et al. |
| 2007/0127186 | A1 | 6/2007 | Ivanciw et al. |
| 2007/0201038 | A1 | 8/2007 | Cummings et al. |
| 2008/0119716 | A1 | 5/2008 | Boric-Lubecke et al. |
| 2009/0051369 | A1 | 2/2009 | Kogut et al. |
| 2010/0321761 | A1 | 12/2010 | Cummings et al. |

FOREIGN PATENT DOCUMENTS

| | | |
|---|---|---|
| EP | 1 630 781 | 3/2006 |
| EP | 1 640 962 | 3/2006 |
| GB | 2 217 839 | 11/1989 |
| JP | 1 263 123 | 12/2002 |
| WO | WO 01/73934 | 10/2001 |
| WO | WO 02/093116 | 11/2002 |
| WO | WO 2006/036391 | 4/2006 |
| WO | WO 2006/036847 | 4/2006 |
| WO | WO 2007/043051 | 4/2007 |
| WO | WO 2007/0124357 | 11/2007 |
| WO | WO 2007/149284 | 12/2007 |

OTHER PUBLICATIONS

Office Action dated Dec. 16, 2011 in U.S. Appl. No. 12/367,423.

Office Action dated Jan. 5, 2012, in U.S. Appl. No. 12/242,770.

Office Action dated Aug. 15, 2011 in Chinese App. No. 200980104857.5.

Braghin et al., 2006, Nonlinear dynamics of vibrating MEMS, Sensors and Actuators A, 134((1):98-108.

Castaner et al., Sep. 1999, Speed-energy optimization of electrostatic actuators based on pull-in, Journal of Microelectromechanical Systems, 8(3):290-298.

Karkkainen et al., Jun. 2004, AC voltage reference based on a capacitive micromechanical component, Precision Electromagnetic Measurements Digest, 119-120.

Mol et al., 2005, High-resolution capacitate measurement of microstructure displacement using coherent detection, Eurosensors XIX Conference, Barcelona, Spain, 4 pp.

Murakoshi et al., 2003, Electrostatically levitated ring-shaped rotational-gyro/accelerometer, Japanese Journal of Applied Physics, 42(48):2468-2472.

Panchawagh et al., 2008, Characterization of silicon parallel-plate electrostatic actuator in partially conducting aqueous solution, MEMS 2008, Tucson, AZ, pp. 495-498.

Pons-Nin et al., Jun. 2002, Voltage and pull-in time in current drive of electrostatic actuators, Journal of Microelectromechanical Systems, 11(3):196-205.

Zhang et al., Mar. 2007, Nonlinear dynamic analysis of electrostatically actuated resonant MEMS sensors under parametric excitation, Sensors Journal, 7(3):370-380.

Zhao et al., 2004, A study of dynamic characteristics and simulation of MEMS torsional micromirrors, Sensors and Actuators A, 120(1):199-210.

ISR and WO for PCT/US09/033271 dated Mar. 1, 2010.

ISR and WO for PCT/US09/033264, dated Mar. 4, 2010.

Invitation to Pay Additional Fees in PCT/US09/033268, dated Mar. 4, 2010.

Castaner et al., May 1, 2000, Pull-in time-energy product of electrostatic actuators: comparison of experiments with simulation, Sensors and Actuators, 83(1-3):263-269.

ISR and WO for PCT/US09/033259 dated Jun. 1, 2010.

ISR and WO for PCT/US09/033268, dated Jun. 2, 2010.

Cigada et al., Feb. 28, 2007, Electrical method to measure the dynamic behaviour and the quadrature error of a Mems gyroscope sensor, Sensors and Actuators, 134(1):88-97.

Langfelder et al., 2008, Low-noise real-time measurement of the position of movable structures in MEMS, Sensors and Actuators, 148(2):401-406.

Osterberg et al., 1997, M-test: a test chip for MEMS material property measurement using electrostatically actuated test structures, Journal of Microelectricalmechanical systems, 6(2):107-11.

Uranga et al., May 6, 2007. Electrical detection of multiple resonant modes in a CMOS-MEMS cantilever, Microelectronic Engineering 84(5-8):1374-1378.

ISR and WO for PCT/US09/033471, dated Jul. 6, 2009.

ISR and WO for PCT/US09/033473, dated Jun. 24, 2009.

Conner, "Hybrid Color Display Using Optical Interference Filter Array," SID Digest, pp. 577-580 (1993).

van Drieenhuizen, et al., "Comparison of Techniques for measuring Both Compressive and Tensile Stress in Thin Films." Sensors and Actuators, vol. 37-38, pp. 759-765. (1993).

Guckel et al., "Fine-Grained Polysilicon Films with Built-In Tensile Strain," IEEE Transactions on Electron Devices, vol. 35, No. 6, pp. 801-802, (1988).

Jerman et al., "A Miniature Fabry-Perot Interferometer with a Corrugated Silicon Diaphragm Support," IEEE Electron Devices Society (1988).

Lin et al., "A Micro Strain Gauge with Mechanical Amplifier," J. of Microelectromechanical Systems, vol. 6, No. 4, (1997).

Miles, "MEMS-based interferometric modulator for display applications," Proc. SPIE vol. 3876, pp. 20-28, Sep. 1999.

Miles, "5.3: Digital Paper™: Reflective Displays Using Interferometric Modulation," SID 00 Digest, pp. 32-35 (2000).

Miles, 10.1: Digital Paper™ for Reflective Displays, SID 02 Digest, pp. 115-117 (2002).

Miles et al., "Digital Paper™ for Reflective Displays," J. of the Society for Information Display Soc. Inf. Display USA. vol. 11, No. 1, p. 209-215. (2003).

Raley et al., "A Fabry-Perot Microinterferometer for Visible Wavelengths," IEEE Solid-State Sensor and Actuator Workshop, Hilton Head, SC (1992).

Singh et al., "Strain Studies in LPCVD Polysilicon for Surface Micromachined Devices," Sensors and Actuators, vol. 77, pp. 133-138, (1999).

Srikar et al., "A Critical Review of Microscale Mechanical Testing Methods Used in the Design of Microelectromechanical Systems," Society for Experimental mechanics, vol. 43, No. 3, (2003).

Zhang, et al., "Measurements of Residual Stresses in Thin Films Using Micro-Rotating-Structures." Thin Solid Films, vol. 335, pp. 97-105, (1998).
Office Action dated Mar. 3, 2011 in U.S. Appl. No. 12/367,423.
Office Action dated Mar. 25, 2011 in U.S. Appl. No. 12/242,788.
Jin et al., 1998, Electrostatic resonator with second superharmonic resonance, Sensors and Actuators A, 64:273-279.
Office Action dated Oct. 6, 2011 in U.S. Appl. No. 12/367,428.
Office Action dated Oct. 14, 2011 in U.S. Appl. No. 12/242,788.
Dumas et al., 2007, A novel approach for online sensor testing based on an encoded test stimulus, 12th IEEE European Test Symposium, pp. 105-110.
International Business Machines Corporation, Apr. 1, 2000, Half contact array testing method for TFT array, Research Disclosure, Mason Publications, Hampshire, GB, 423(167), abstract, 1 p.
IPRP WO for PCT/US09/033271 dated Aug. 26, 2010.
IPRP for PCT/US09/033259 dated Aug. 26, 2010.
IPRP for PCT/US09/033471, dated Aug. 26, 2010.
IPRP for PCT/US09/033264, dated Aug. 26, 2010.
IPRP for PCT/US09/033473, dated Aug. 26, 2010.
IPRP for PCT/US09/033268, dated Aug. 26, 2010.
ISR and WO dated Jul. 1, 2010 in PCT/US09/033261.
IPRP dated Aug. 26, 2010 in PCT/US09/033261.
Office Action dated Jul. 21, 2011 in U.S. Appl. No. 12/242,763.
Office Action dated Jul. 13, 2011 in U.S. Appl. No. 12/367,423.
Office Action dated Jul. 14, 2011 in U.S. Appl. No. 12/242,770.
Office Action dated May 16, 2012 in U.S. Appl. No. 12/367,423.
Office Action dated May 4, 2012 in U.S. Appl. No. 12/367,428.
Office Action dated Feb. 17, 2012 in Chinese. App. No. 200980104856.0.

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

METHODS FOR CHARACTERIZING THE BEHAVIOR OF MICROELECTROMECHANICAL SYSTEM DEVICES

CROSS-REFERENCE TO RELATED APPLICATIONS

The present application claims priority to U.S. Provisional Application No. 61/027,781, filed Feb. 11, 2008, the disclosure of which is hereby incorporated by reference in its entirety.

BACKGROUND OF THE INVENTION

Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one aspect, a method of identifying a transition voltage in a microelectromechanical system (MEMS) device is provided, the method including applying a substantially constant source current to the MEMS device, measuring a voltage across the MEMS device as a function of time, determining the rate of change of the measured voltage, and identifying a discontinuity in the rate of change of the measured voltage, where the voltage at which the discontinuity occurs corresponds to a transition voltage of the MEMS device.

In another aspect, a method of identifying a transition voltage in a microelectromechanical system (MEMS) device is provided, the method including applying a substantially constant source current to the MEMS device, measuring a voltage across the MEMS device as a function of time, and identifying a beginning or end of a transition period in the measured voltage, where a voltage at which the transition period begins or ends corresponds to a transition voltage of the MEMS device.

In another aspect, a method of determining a transition voltage of an interferometric modulator is provided, the interferometric modulator including a movable electrode, a fixed electrode, and an optical stack, the method including applying a source current to the interferometric modulator, measuring a voltage across the interferometric modulator as a function of time, and identifying a discontinuity in a rate of change of the measured voltage, where a voltage at which the discontinuity occurs corresponds to a transition voltage of the interferometric modulator.

In another aspect, a device is provided, including a microelectromechanical system (MEMS) device, and circuitry configured to apply a source current to the MEMS device, measure a voltage across the MEMS device, identify a discontinuity in a rate of change of the measured voltage, and determine a transition voltage of the MEMS device based upon the identified discontinuity in the measured voltage.

In another aspect, a device is provided, including means for applying a source current to a microelectromechanical (MEMS) device, means for measuring a voltage across the MEMS device, and means for determining a transition voltage of the MEMS device based upon an identified discontinuity in the rate of change of the measured voltage.

In another aspect, a method of identifying a transition voltage in a MEMS device is provided, the method including providing a circuit including a microelectromechanical system (MEMS) device, the circuit being configured to provide a substantially constant impedance for an applied voltage, applying a constant voltage to the circuit for a period of time, measuring a voltage across the MEMS device as a function of time, and identifying a transition voltage based upon the measurement of the voltage as a function of time.

In another aspect, a method of identifying a transition voltage in an array of microelectromechanical system (MEMS) devices is provided, the method including applying a driving voltage which remains substantially constant for a period of time to an array of MEMS devices arranged in parallel, where the driving voltage is applied via a circuit including a resistance in series with the array of MEMS devices, and where the resistance in series with the array of MEMS devices is substantially larger than the resistance of the array of MEMS devices, measuring a resultant voltage across the array of MEMS devices as a function of time, and identifying a transition voltage at which the resultant voltage remains substantially constant for a period of time during transition of the MEMS devices within the array from a first state to a second state.

In another aspect, a method of determining a transition voltage in microelectromechanical system (MEMS) devices is provided, the method including applying a driving voltage including a substantially square waveform to the MEMS device using a circuit configured to provide a substantially constant impedance for an applied voltage, measuring a voltage across the MEMS device as a function of time, and determining at least a first transition voltage where the voltage across the MEMS device remains substantially constant for a period of time.

In another aspect, a device is provided, including a circuit including a microelectromechanical system (MEMS) device, where the circuit is configured to provide a substantially constant impedance for an applied voltage, and circuitry configured to apply a constant voltage to the MEMS device for a period of time, measure a voltage across the MEMS device as a function of time, and identify a transition voltage based upon the measurement of the voltage as a function of time.

In another aspect, a device is provided, including means for maintaining a constant impedance for an applied voltage, means for applying a voltage to a microelectromechanical system (MEMS) device, where the voltage remains substantially constant for a period of time, means for measuring a voltage across the MEMS device, and means for identifying a transition voltage of the MEMS device based on the measured voltage.

In another aspect, a method of characterizing the behavior of a microelectromechanical system (MEMS) device is provided, the method including applying a driving voltage signal to the MEMS device, where the MEMS device includes a movable layer, measuring a current through the MEMS device as a function of time, integrating the current over a period of time, and determining an operational characteristic of the MEMS device based upon the integrated current.

In another aspect, a method of characterizing the dynamic behavior of a microelectromechanical system (MEMS) device is provided, the method including applying a driving voltage to an MEMS device for a first period of time, the MEMS device including a movable electrode and a fixed electrode, measuring a current through the MEMS device as a function of time over a second period of time, the second period of time including at least a portion of the first period of time, and determining the dynamic behavior of the MEMS device based on an integration of the current.

In another aspect, a method of determining a damping force exerted on a movable layer of a microelectromechanical system (MEMS) device is provided, the method including applying a driving voltage signal to the MEMS device, where the MEMS device includes a movable layer, and where the driving voltage causes the movable layer to move, measuring a current through the MEMS device as a function of time, integrating the current over a period of time, and determining the damping force exerted on the movable layer based on the integrated current.

In another aspect, a device is provided, including a microelectromechanical system (MEMS) device including a movable layer, and circuitry configured to apply a driving voltage signal to the MEMS device to induce movement of the movable layer, measure a current through the MEMS device as a function of time, integrate the current over a period of time, and determine a behavioral characteristic of the MEMS device based on the integrated current.

In another aspect, a device is provided, including means for inducing movement of a movable layer of a MEMS device, means for measuring a current through the MEMS device, means for integrating the current over a period of time, and means for characterizing a behavior of the MEMS device based upon the integrated current.

In another aspect, a method of characterizing the behavior of a microelectromechanical system (MEMS) device is provided, the method including applying a sinusoidal voltage signal to the MEMS device, where the MEMS device includes a movable electrode spaced apart from another electrode, measuring an output signal, identifying frequency components of the output signal, and determining whether the frequency components of the output signal are indicative of non-linear behavior of the MEMS device.

In another aspect, a method of identifying transition voltages of a microelectromechanical system (MEMS) device is provided, the method including consecutively applying a plurality of sinusoidal voltage signals to the MEMS device, where the voltage ranges spanned by each of the plurality of sinusoidal voltage signals are different from one another, measuring a current through the MEMS device in response to each of the plurality of sinusoidal voltage signals, identifying frequency components of the measured current, and determining whether the range of one of the plurality of voltage signals includes a transition voltage based upon the frequency components of the measured current in response to the application of the one of the plurality of voltage signals.

In another aspect, a device is provided, including a microelectromechanical system (MEMS) device including a movable layer, circuitry configured to apply a sinusoidal voltage signal to the MEMS device, measure a current through the MEMS device, identify frequency components of the measured current, and determine whether the frequency components of the measured current are indicative of non-linear behavior of the MEMS device.

In another aspect, a device is provided, including means for applying a sinusoidal voltage to a microelectromechanical system (MEMS) device, means for measuring a current through the MEMS device, means for identifying frequency components of the measured current, and means for determining whether the frequency components of the measured current are indicative of non-linear behavior of the MEMS device.

In another aspect, a method of determining a restoring force of a movable layer of a microelectromechanical system (MEMS) device is provided, the method including applying a driving signal to the MEMS device, the MEMS device including a movable electrode and a fixed electrode, where the driving signal induces movement of the movable electrode relative to the fixed electrode, measuring a current through the MEMS device during movement of the movable electrode, identifying frequency components of the measured current, and utilizing the frequency components of the measured current to determine the restoring force acting on the movable electrode.

In another aspect, a method of characterizing mechanical characteristics of a microelectromechanical system (MEMS) device including a movable layer is provided, the method including placing the MEMS device in a low-pressure environment, applying a driving signal to the MEMS device to induce movement of the movable layer, measuring a current through the MEMS device during movement of the movable layer, and determining a frequency at which the movable layer oscillates.

In another aspect, a device is provided, including a microelectromechanical system (MEMS) device including a movable layer, circuitry configured to apply a driving signal to the MEMS device to induce movement of the movable layer, measure a current through the MEMS device, determine a frequency at which the movable layer oscillates, and determine a restoring force acting on the movable layer.

In another aspect, a device is provided, including means for inducing movement of a movable layer of a microelectromechanical system (MEMS) device, means for measuring a current through the MEMS device, means for determining a frequency at which the movable layer oscillates, and means for determining a restoring force acting on the movable layer.

In another aspect, a display module is provided, including a display including a plurality of microelectromechanical system (MEMS) devices, where the MEMS devices each include a movable electrode and a fixed electrode, driver circuitry configured to drive the MEMS-based display, and monitoring circuitry configured to apply a driving signal to at least one of the plurality of MEMS devices, where the driving signal induces movement of the movable electrode relative to the fixed electrode, measure a current through the at least one of the plurality of MEMS devices, determine a frequency at which the movable layer oscillates, and determine a restoring force acting on the movable layer.

In another aspect, a method of measuring one or more electrical characteristics of a microelectromechanical system (MEMS) device is provided, the method including applying a first signal to the MEMS device, where the first signal includes a periodic electrical stimulus, measuring an output signal of the MEMS device, and combining a second signal with the output signal to obtain a resultant signal indicative of the one or more electrical characteristics of the MEMS device, where the second signal is orthogonal to the first signal.

In another aspect, a device is provided, including a microelectromechanical system (MEMS) device, and circuitry configured to apply a periodic f electrical stimulus to the MEMS device, measure an output signal of the MEMS device, and combine the output signal with a second signal orthogonal to the first signal to obtain a resultant signal, the resultant signal indicative of one or more electrical characteristics of the MEMS device.

In another aspect, a device is provided, including means for applying a periodic electrical stimulus to a microelectromechanical system (MEMS) device, means for measuring an output signal of the MEMS device, and means for correlating the output signal with a second signal orthogonal to the output signal to obtain a resultant signal, the resultant signal indicative of one or more electrical characteristics of the MEMS device.

In another aspect, a display module is provided, including a display including a plurality of microelectromechanical system (MEMS) devices, where the MEMS devices include a movable electrode and a fixed electrode, driver circuitry configured to drive the MEMS-based display, and monitoring circuitry configured to apply a driving signal to at least one of the MEMS devices, where the driving signal includes a periodic electrical signal, measure the current through the at least one of the MEMS devices, and correlate the measured current with a second signal to obtain a resultant signal, the resultant signal indicative of one or more electrical characteristics of the at least one of the MEMS devices.

In another aspect, a method of measuring electrical characteristics of a microelectromechanical system (MEMS) device is provided, the method including modulating an initial signal with an additional signal to generate an input signal, where the additional signal includes a random or pseudo-random signal, applying the input signal to the MEMS device, measuring an output signal of the MEMS device, demodulating the output signal to obtain a resultant signal, where the resultant signal is indicative of a response of the MEMS device to the initial signal, and determining an electrical characteristic of the MEMS device based at least in part upon the resultant signal.

In another aspect, a method of reducing an effect of interference on a measured signal characteristic of a microelectromechanical system (MEMS) device is provided, the method including modulating an input signal with a modulation signal to generate an modulated input signal, where the modulation signal includes a significant amount of randomness, applying the modulated input signal to the MEMS device, measuring an output signal of the MEMS device, and demodulating the output signal to obtain a resultant signal, where the resultant signal is indicative of a response of the MEMS device to the input signal.

In another aspect, a method of determining a capacitance of an interferometric modulator is provided, the method including modulating an input voltage signal with a modulation signal to obtain a modulated input signal, where the modulation signal includes a random or pseudo-random signal, applying the modulated input signal to the interferometric modulator, measuring a current through the interferometric modulator, demodulating the measured current using a corrective signal to obtain a resultant signal, where the corrective signal includes a time-based integral of the modulation signal, and determining the capacitance of the interferometric modulator based at least in part on the resultant signal.

In another aspect, a device, is provided including a microelectromechanical system (MEMS) device, and circuitry configured to apply a modulated driving signal to the MEMS device, where the modulated driving signal is generated by modulating an initial driving signal with a modulation signal having a high amount of randomness, measure an output signal of the MEMS device, and demodulate the output signal to obtain a resultant signal indicative of the response of the MEMS device to the initial driving signal.

DETAILED DESCRIPTION OF THE PREFERRED EMBODIMENT

Figure 1:
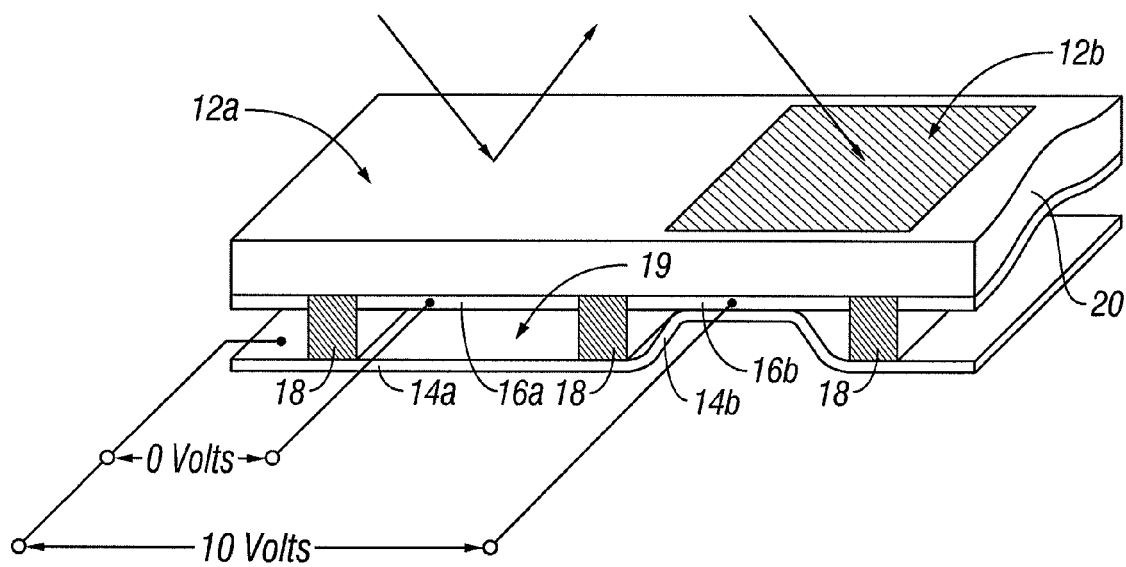
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Accurate characterization of the properties of interferometric modulators and similar MEMS devices facilitates quality control and proper operation of such devices, as well as the design of future devices. In particular, electrical characterization of the devices may enable the measurement of such devices without the need for optical measuring equipment, reducing the complexity of the testing equipment. In certain embodiments, the characterization of such devices may be done using specific testing circuitry, while in other embodiments, the circuitry used to perform the characterization may be integrated into the driving circuitry of a device. As such, the characterization can be used by the driving circuitry to modify or adjust a predetermined driving scheme on the fly.

In certain embodiments, voltage measurements across an interferometric modulator may be measured while the interferometric modulator is driven, in order to characterize the interferometric modulator by identifying transition voltages. In other embodiments, the current through an interferometric modulator may be measured during operation to provide an indication of the dynamic behavior of the interferometric modulator. In particular embodiments, this may be done by integrating the measured current, or by performing frequency analysis on the measured current. Such frequency analysis may be used to characterize static or dynamic mechanical properties of the interferometric modulator, or provide information regarding the hysteresis behavior of the interferometric modulator. In other embodiments, the capacitance of the interferometric modulator may be analyzed by correlating a drive signal with a related signal. In other embodiments, spread-spectrum analysis may be used to minimize the effect of noise or interference on the characterization process.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
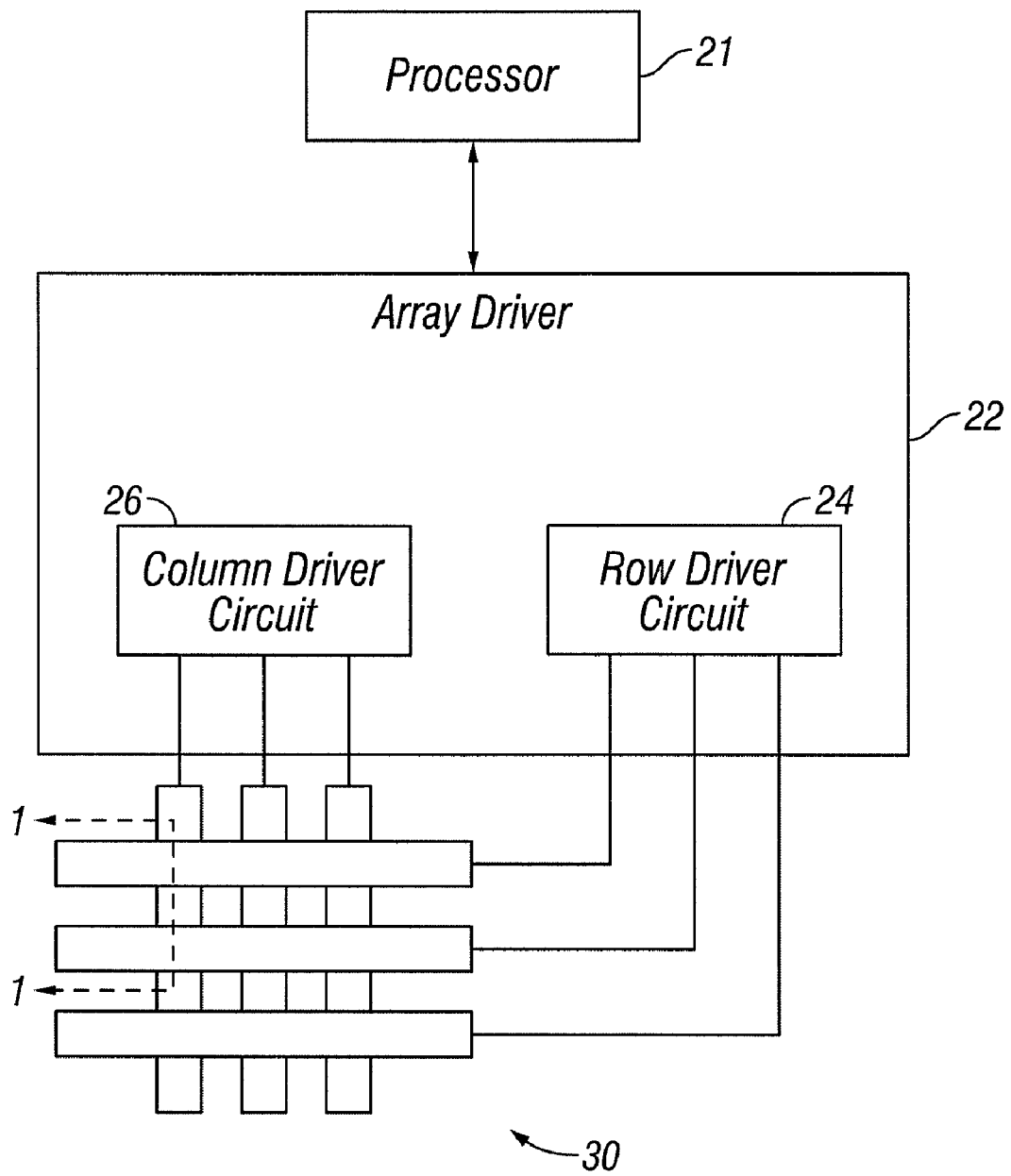
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
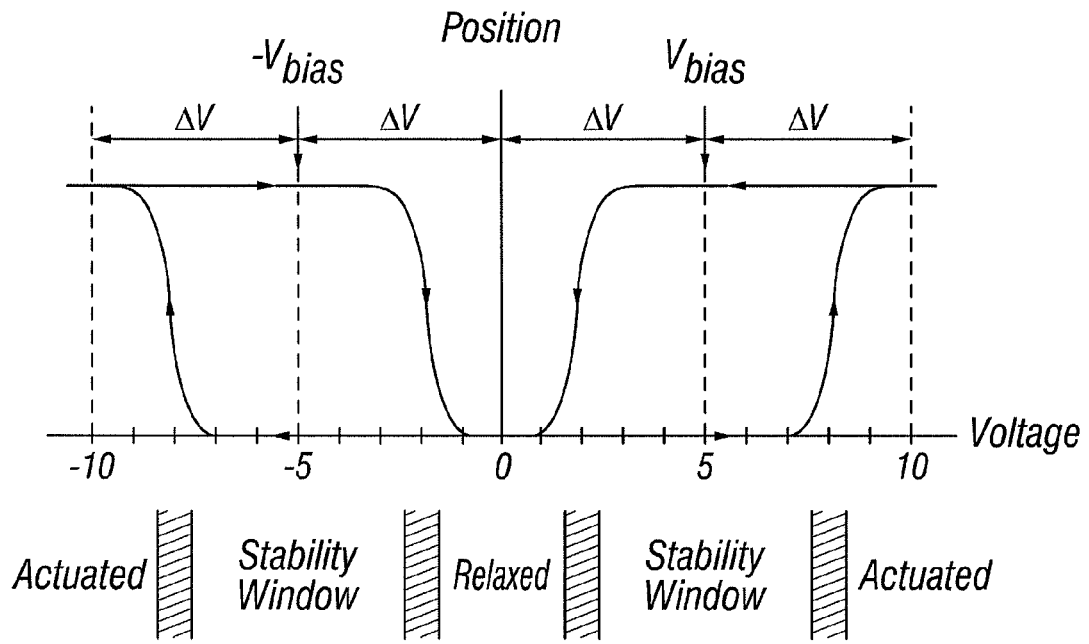
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
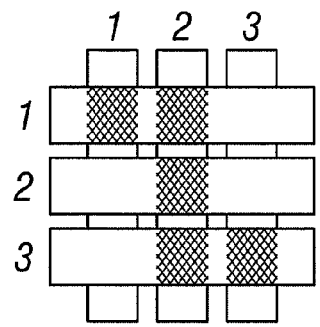
FIG. 5A illustrates one exemplary frame of display data in the 3×3 interferometric modulator display of FIG. 2.
Figure 5B:
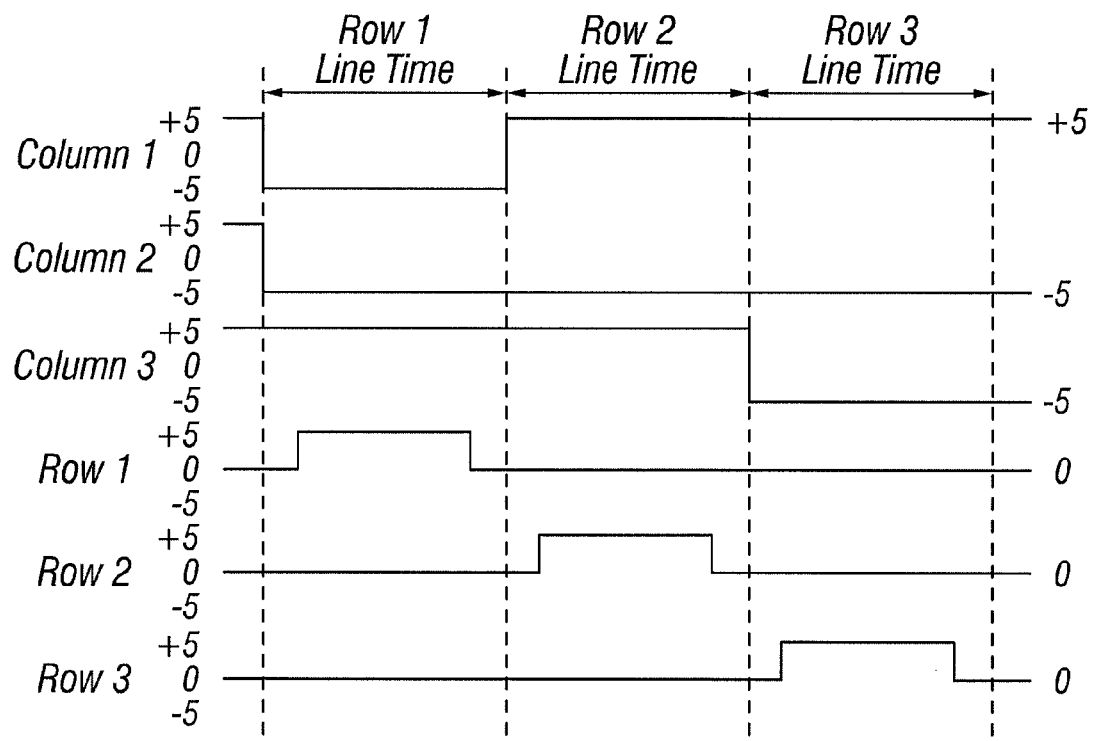
FIG. 5B illustrates one exemplary timing diagram for row and column signals that may be used to write the frame of FIG. 5A.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
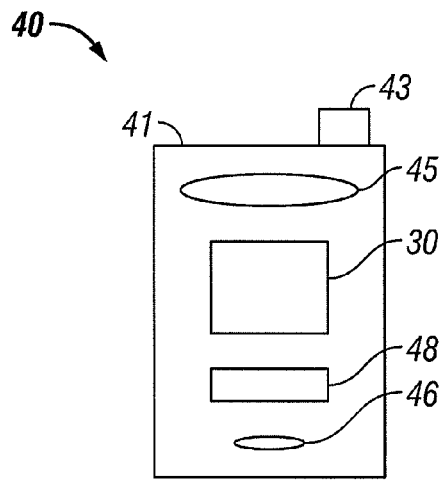
FIGS. 6A and 6B are system block diagrams illustrating an embodiment of a visual display device comprising a plurality of interferometric modulators.
Figure 6B:
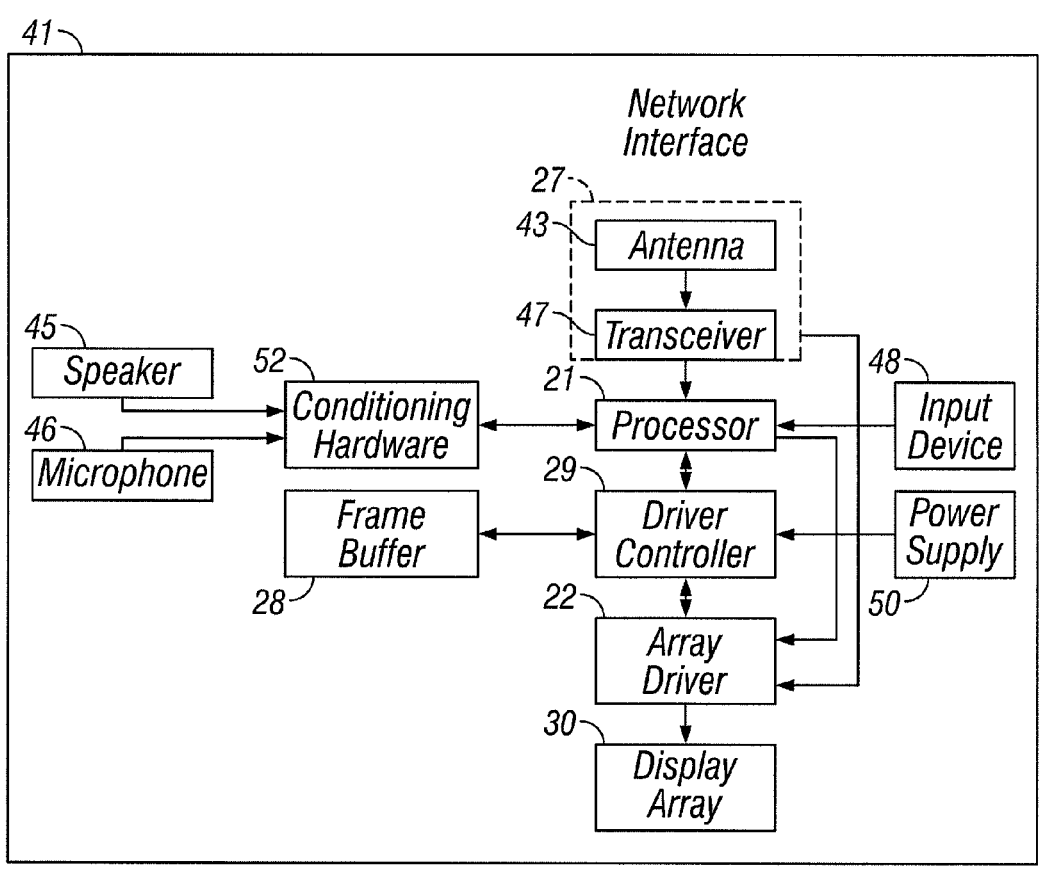

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
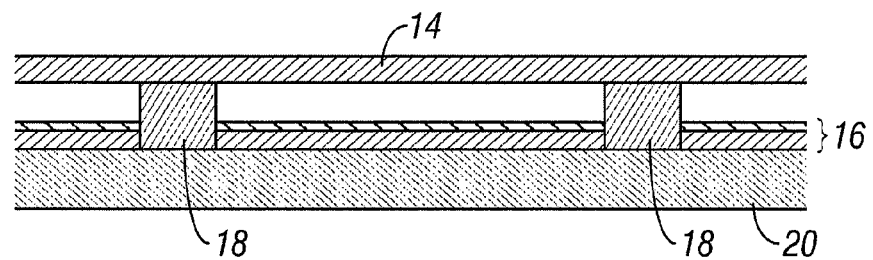
FIG. 7A is a cross section of the device of FIG. 1.
Figure 7B:
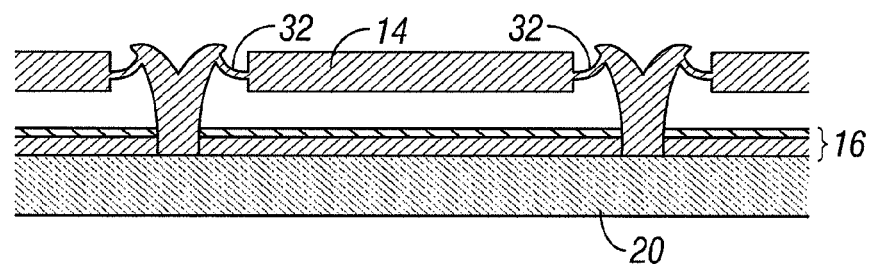
FIG. 7B is a cross section of an alternative embodiment of an interferometric modulator.
Figure 7C:
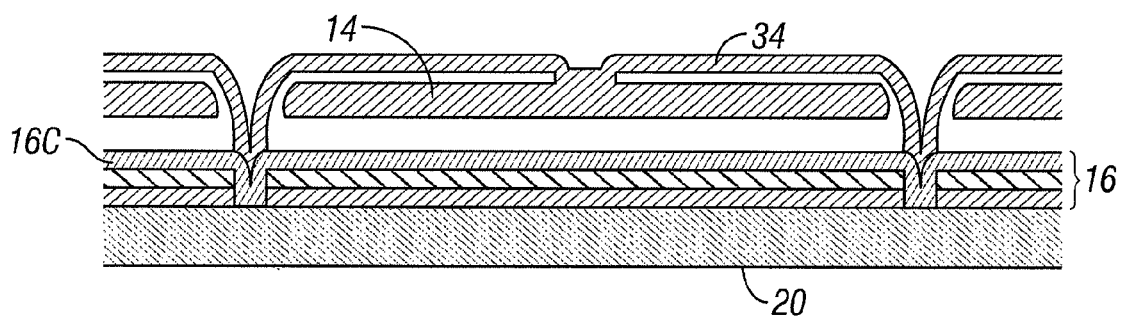
FIG. 7C is a cross section of another alternative embodiment of an interferometric modulator.
Figure 7D:
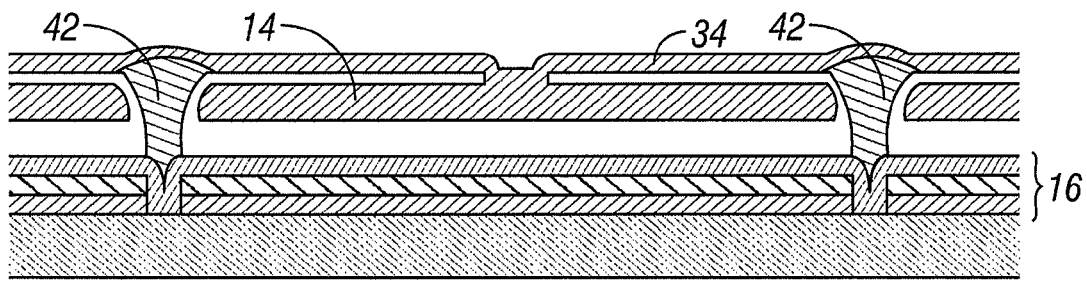
FIG. 7D is a cross section of yet another alternative embodiment of an interferometric modulator.
Figure 7E:
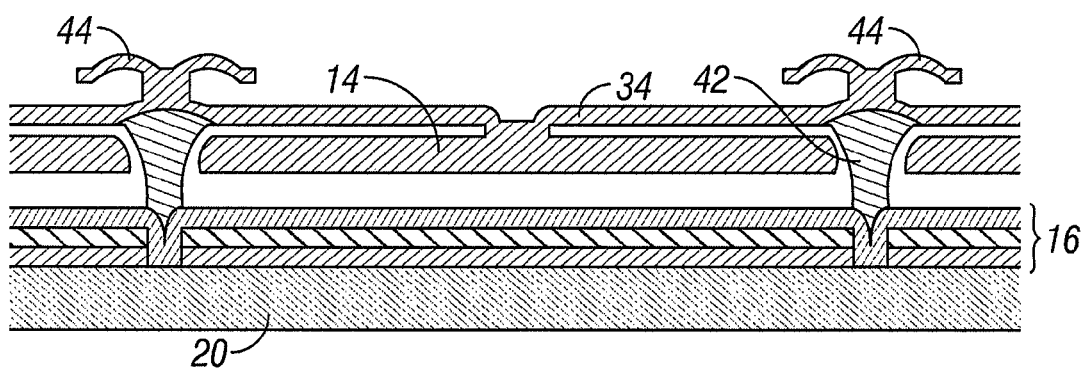
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Display devices like those based on interferometric modulator technology may be measured and characterized with one or more optical, electronic and/or mechanical techniques. Depending on the display technology, these measurements can form a part of calibration of the display module (the display "module" referred to herein includes the display panel, the display driver, and associated components such as cabling, etc.), and the measurement parameters may be stored into a non-volatile memory (e.g., NVRAM) in the display module for future use.

As discussed above with reference to FIG. 3, the interferometric modulators operate based on a potential difference applied to them. FIG. 3 shows that the interferometric modulators are in either the relaxed (or released) state or in the actuated state, depending on the magnitude of the potential difference applied between their electrodes. As shown, the changing of one state to another happens according to a hysteretic characteristic with a stability (or hold) window, where the device holds its current state when the applied potential difference falls within the hold window. As used herein, a "bias voltage" refers to a potential difference that falls within the hold window. Accordingly, as shown in FIG. 3, there are five input voltage difference ranges in some embodiments.

Each of the five voltage difference ranges has a title reflecting its effect on the state of the interferometric modulator. Starting from the left of FIG. 3, the five voltage difference ranges are: 1) negative actuate ("Actuated"); 2) negative hold ("Stability Window"); 3) release ("Relaxed"); 4) positive hold ("Stability Window"); and 5) positive actuate ("Actuated"). Based on theoretical understanding of the devices and past experimental results, approximate values of the thresholds between these input voltage difference ranges may be known, but in order to more optimally operate the interferometric modulator array, the threshold voltages can be measured with more precision.

For example, as described further herein, the thresholds may vary from device to device, lot to lot, over temperature, and/or as the device ages. Threshold values may accordingly be measured for each manufactured device or group of devices, but doing so across the entire operational envelope may be difficult or impractical, and may not provide a real-time indication of the operational performance of the interferometric modulator. One method of measuring the threshold voltages is to apply inputs of various voltage differences while monitoring the state of the interferometric modulators through observation of the optical characteristics of the interferometric modulators. This may be accomplished, for example, through human observation or by use of an optical measurement device. Additionally or alternatively, the state of the interferometric modulators may be monitored through electronic response measurement. In some embodiments, the array driver 22 of the display array 30, discussed above, may be configured to measure electrical responses of display elements in order to determine the state and/or operational characteristics of the display elements according to the methods discussed below.

Often times, the behavior of a display device changes with the age of the display device, with variations in temperature of the display, with the content of the images being displayed, etc. Display devices may have one or more electrical parameters that change in relation to the optical response or optical state. As discussed above, the interferometric modulator is set to an actuated state when the electrostatic attraction between the reflective layer and the optical stack is great enough to overcome the mechanical restorative forces working to hold the reflective layer in the relaxed state. Because the reflective layer, the optical stack, and the gap between them form two conductive plates separated by a dielectric in some embodiments, the structure has a capacitance. Also, because the capacitance of the structure varies according to the distance between the two plates, the capacitance of the structure varies according to the state of the interferometric modulator. Therefore, an indication of the capacitance can be used to determine the state of the interferometric modulator.

As will be discussed in greater detail below, various methods may be used to characterize interferometric modulators or similar MEMS devices by determining various properties of the interferometric modulators. In certain embodiments, the response of the interferometric modulators to various inputs may be used to determine, for example, threshold voltages of the type discussed above, or the capacitance of the interferometric modulators. In other embodiments, the dynamic response of an interferometric modulator may be characterized, by determining mechanical characteristics of the interferometric modulator, such as the mechanical restoring force acting on the movable electrode.

In certain embodiments, such characterizations may be done after fabrication of the interferometric modulators, as a quality control measure or as a part of a refinement of a manufacturing process. In other embodiments, the characterizations may be done during normal operation of the interferometric modulator, in order to determine whether certain characteristics have changed over time or in response to changes in operating conditions.

Voltage Measurements

In certain embodiments, the voltage across a MEMS device may be measured while the device is driven, and the recorded data of voltage as a function of some other parameter analyzed in order to determine voltage values corresponding to transition voltages. This may facilitate rapid and accurate characterization of the properties of interferometric modulators and other MEMS devices without the use of an optical measurement instrument to determine when actuation has occurred. In certain embodiments, one of the current or the impedance may be held substantially constant during the testing procedure to facilitate analysis of the data and determination of transition voltages.

In one embodiment, substantially constant current may be applied to an interferometric modulator, and the voltage across the interferometric modulator analyzed to identify discontinuities corresponding to a transition voltage. In a particular embodiment, an interferometric modulator begins in the up, relaxed, or unactuated, state, for example as shown in the state of modulator 12a in FIG. 1. A constant current is applied across the interferometric modulator, gradually increasing the voltage across the interferometric modulator as electrostatic charge accumulates on the electrodes. Once sufficient charge has accumulated on the electrodes to increase the voltage across the interferometric modulator to the transition voltage, the interferometric modulator collapses to a down, or actuated, state, for example as shown in the state of modulator 12b in FIG. 1. In certain embodiments, this substantially constant current may comprise a variation of less than ±20%, although in certain embodiments, larger current variations may be tolerated, and smaller current variations may increase the accuracy of measurements or calculations made during such a testing the process.

Figure 8A:
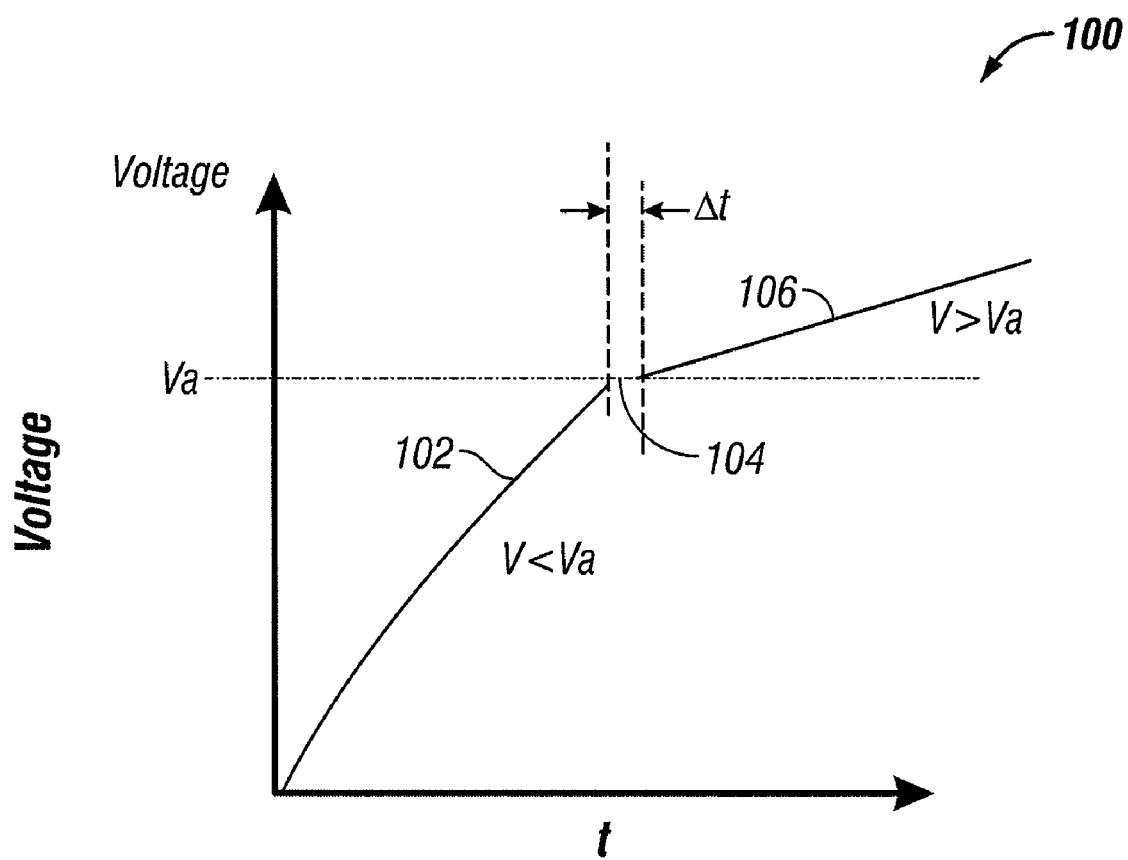
FIG. 8A is a plot of voltage across an interferometric modulator as a function of time when constant current is applied to the interferometric modulator, including a transition period where the interferometric modulator is actuated.

FIG. 8A illustrates the voltage V during this process as a function of time t. This voltage measurement may be performed by, for example, an oscilloscope, such as a digital oscilloscope which is capable of recording the voltage values as a function of time. It can be seen that the plot 100 of V comprises three distinct regions: a pre-transition region 102, where V is less than the actuation voltage Va, a transition region 104 having a duration of Δt, and a post-transition region 106 where the voltage V is greater than the actuation voltage Va. Prior to actuation of the interferometric modulator, accumulation of charge on the electrodes causes the movable electrode to move towards the other electrode. Within the post-transition region 106, the interferometric modulator behaves substantially as a fixed-plate capacitor, as the interferometric modulator acts as a parallel plate capacitor with a dielectric layer between the plates.

The capacitance of the interferometric modulator is thus variable in the pre-transition region 102, depending on the voltage, accounting for the slight curve of the plot of voltage versus time in this region. Specifically, the capacitance C of the modulator in the pre-transition region (V<Va) is given by the following equation, where $C_0$ corresponds to the zero voltage capacitance of the parallel plate capacitor in a non-displaced (relaxed) state with an air cap and a dielectric layer between the plates:

$$C = C_0 + C_1 V + C_2 V^2 + C_3 V^3 \ldots, \quad (1)$$

If we assume that capacitance in the pre-transition region 102 changes slowly with V, we can approximate the change in capacitance as:

$$\Delta C = C_0 + C_1 \Delta V. \quad (2)$$

In such a structure, $C_1$ corresponds to the deviation constant of capacitance change in the region where the applied voltage is far from the transition voltage (e.g., far below the actuation voltage, or far above the release voltage). $C_1$ is typically very small. When $C_1/C_0 \ll 1$, and the source current is given by $I_0$, a more complete derivation gives:

$$\Delta V \sim (I_0/C_0) t - (C_1/C_0)(I_0/C_0)^2 t^2. \quad (3)$$

Figure 8B:
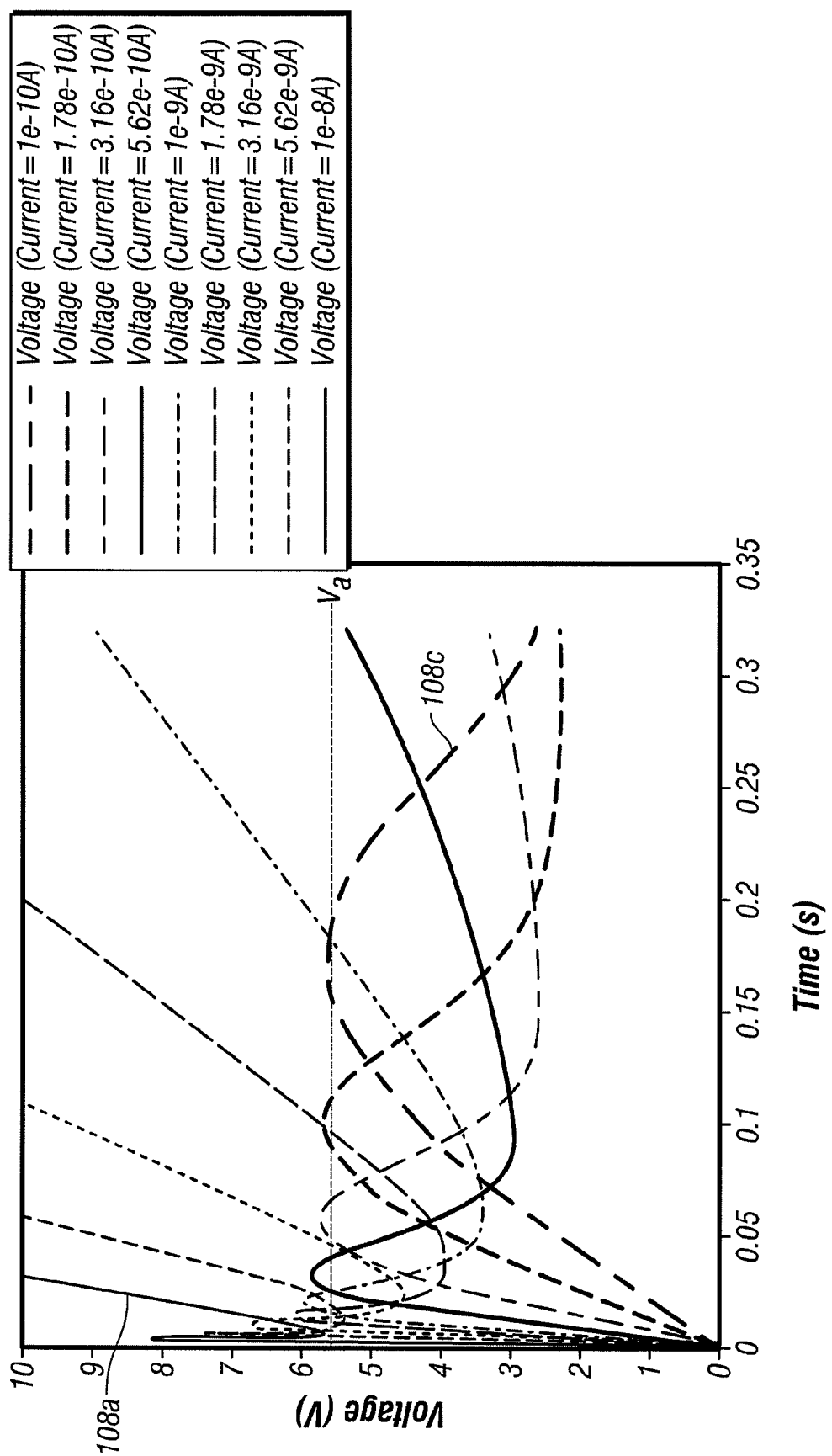
FIG. 8B is a plot of voltage versus time during the transition period of FIG. 8A for a range of source currents, illustrating the variance in the response as a function of source current.
Figure 8C:
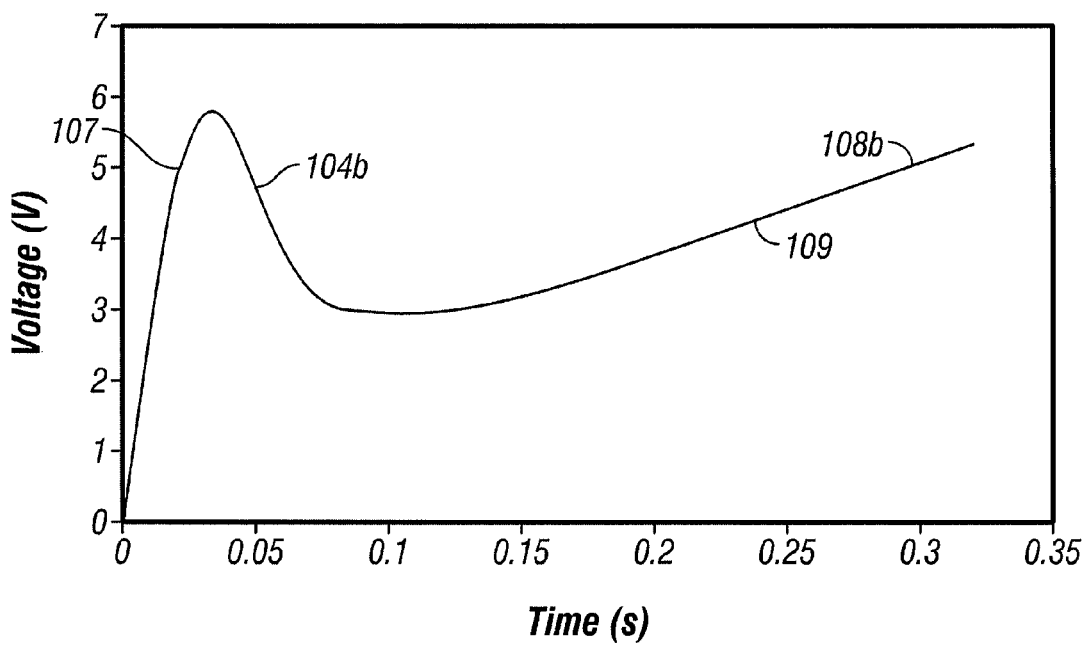
FIG. 8C is a plot of voltage versus time during the transition period of FIG. 8A for a specific source current.

The behavior within the transition region 104 will vary depending on the characteristics of the modulator and the value of the source current $I_0$. FIG. 8B depicts a plurality of simulated voltage measurements as functions of time for a plurality of different source currents $I_0$ ranging between 1 μA and 0.1 mA. FIG. 8C depicts a simulated voltage for a particular source current 108b between 1 μA and 0.1 mA.

With respect to FIG. 8C, it can be seen that, as the voltage initially increases in a region 107, the slope of which is indicative of the released-state capacitance of the interferometric modulator. A transition region 104b then begins with an initial peak, when the interferometric modulator begins to actuate. As the interferometric modulator actuates, the measured voltage within transition region 104b decreases. After the actuation of the interferometric modulator, the interferometric modulator then functions again as a linear capacitor in the down-state, and the voltage increases in a region 109 having a slope which is indicative of the capacitance of the interferometric modulator in the down-state.

With respect to FIG. 8B, it can be seen that the height of the initial peak corresponding to the beginning of the transition period increases as the current increases, as the charge builds up on the interferometric modulator quickly compared to the actuation of the interferometric modulator. At the highest depicted source current, the peak voltage of simulated voltage measurement 108a is almost 3 volts higher than the actuation voltage Va of the interferometric modulator, and the modulator actuates before the measured voltage can return to a voltage below the actuation voltage of the interferometric modulator. As the applied current decreases, the rate of charge buildup relative to the rate of actuation decreases to the point that the initial peak of simulated voltage measurement 108c approaches the actuation voltage Va.

The source current $I_0$ can be selected based upon the characteristics of the interferometric modulator, as well as the desired response for testing purposes. For example, for an ideal interferometric modulator having a load capacitance of 1 pF, ignoring inductive or resistive effects, a constant source current of 1 μA will charge the device to the 10 V range in 10 ms, and a 10 μA will charge the device to the 10 V range in 1 ms. Thus, for an expected voltage range within which the transition voltage is expected to be identified and a desired time period, an appropriate source current value can be selected. As described with respect to FIG. 8B, the source current may also be selected such that the first peak at the beginning of the transition voltage will correspond to the actuation voltage of the interferometric modulator.

In addition, the measured voltage during the transition period can be used to provide an indication of the value of the change in capacitance. Because each of the source current, the transition time, and the transition voltage are either known or can be determined from the measured voltage, the shape of the voltage plot in the transition region can provide an indication of the amount of capacitance change during the actuation, and can be compared to predicted values for the capacitance change.

Such an embodiment of a characterization method enables the identification of transition voltages without the need for (but may allow for) an optical measurement instrument to determine the state of the interferometric modulator, and can be done using relatively simple testing equipment. The testing process can be done over a substantially long period of time relative to the actuation time of the interferometric modulator, and does not require (but may allow for) the identification of a short-term discontinuity in a measured parameter such as current.

In a similar embodiment, this characterization method can be used to test the actuation voltages of an array of interferometric modulators connected in parallel. By applying a constant current through the array of interferometric modulators, there is no need to control where the charge flows, as once actuation of the interferometric modulators begins, actuation of one interferometric modulator will drive others away from concurrent actuation as charge is drawn to the actuating modulator(s). This will reduce the charge on the non-actuated modulators and may cause the movable layer of the non-actuated modulators to move slightly away from the fixed electrode. Overall, however, the voltage across the array of interferometric modulators will remain substantially constant as the modulators in the array successively actuate, until all modulators have actuated. The actuation voltage of an array of interferometric modulators can thus be determined from an analysis of the voltage across the array as a function of time, in similar fashion to that described above.

Figure 9:
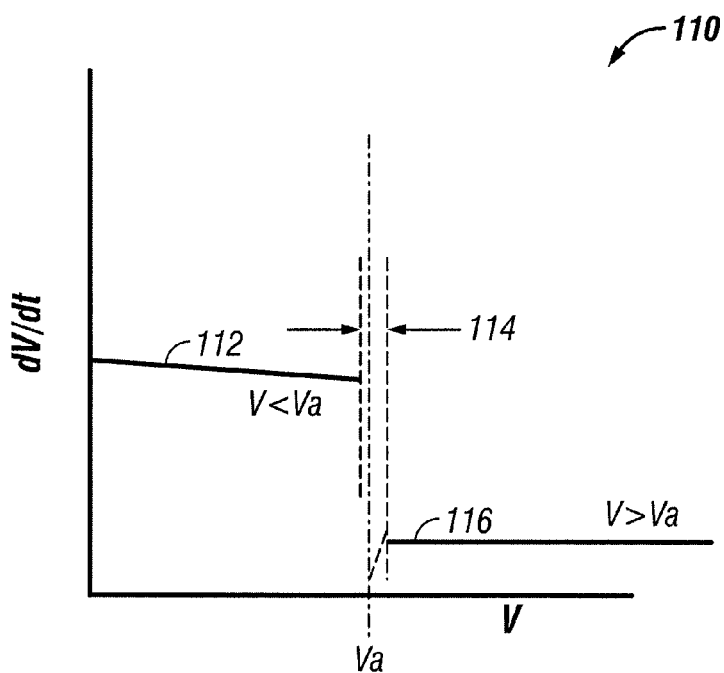
FIG. 9 is a plot of the rate of change of the voltage of FIG. 8A versus voltage.

Additional analysis of the recorded data may be performed, as well. For example, after recording voltage values as a function of time, an analysis of dV/dt as a function of voltage may be generated and utilized to identify a value for Va. As can be seen in FIG. 9, the plot 110 contains a pre-transition region 112, a transition region 114, and a post transition region 116. The discontinuity within the transition region 114 may be used to identify an actuation voltage Va.

Figure 10:
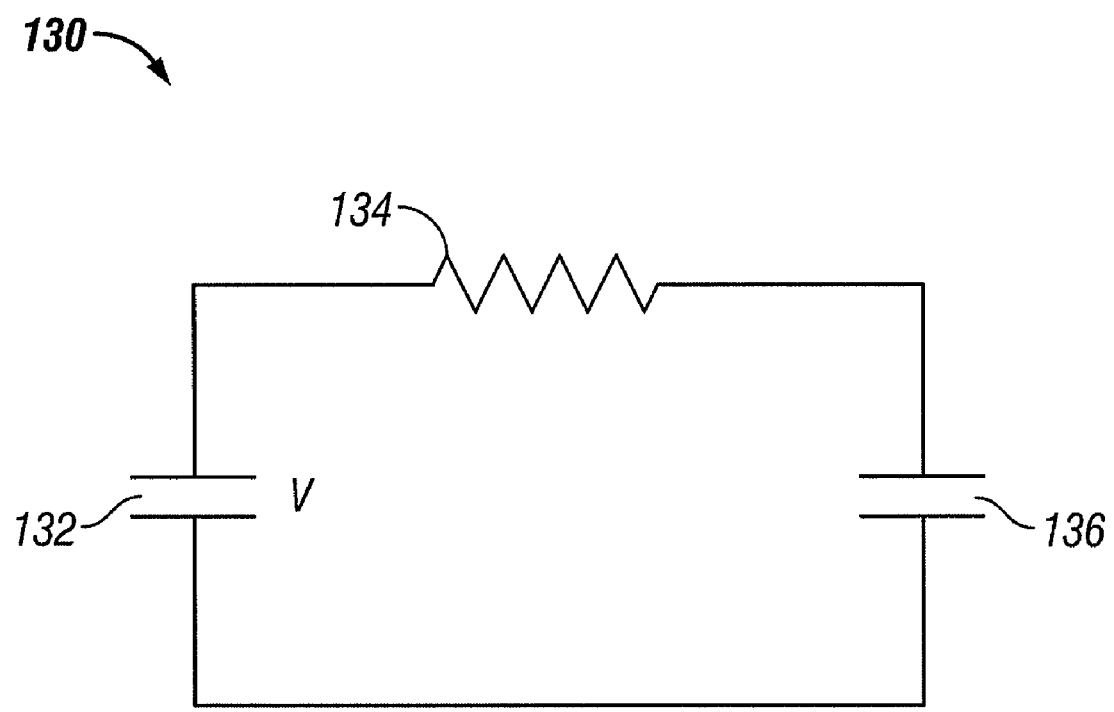
FIG. 10 is a schematic diagram of an electrical circuit comprising a voltage source in series with a resistor and an interferometric modulator.

In another embodiment, controlled impedance may be used to drive an interferometric modulator while voltage across the modulator is measured. FIG. 10 schematically depicts a circuit 130 including a voltage source 132, a resistor 134, and an interferometric modulator 136 which functions as a variable capacitor. In a particular embodiment, the use of a resistor 134 in the circuit 130 which is sufficiently large will keep the impedance substantially constant in the path of the voltage drive and the interferometric modulator, regardless of the state of the interferometric modulator.

Figure 11A:
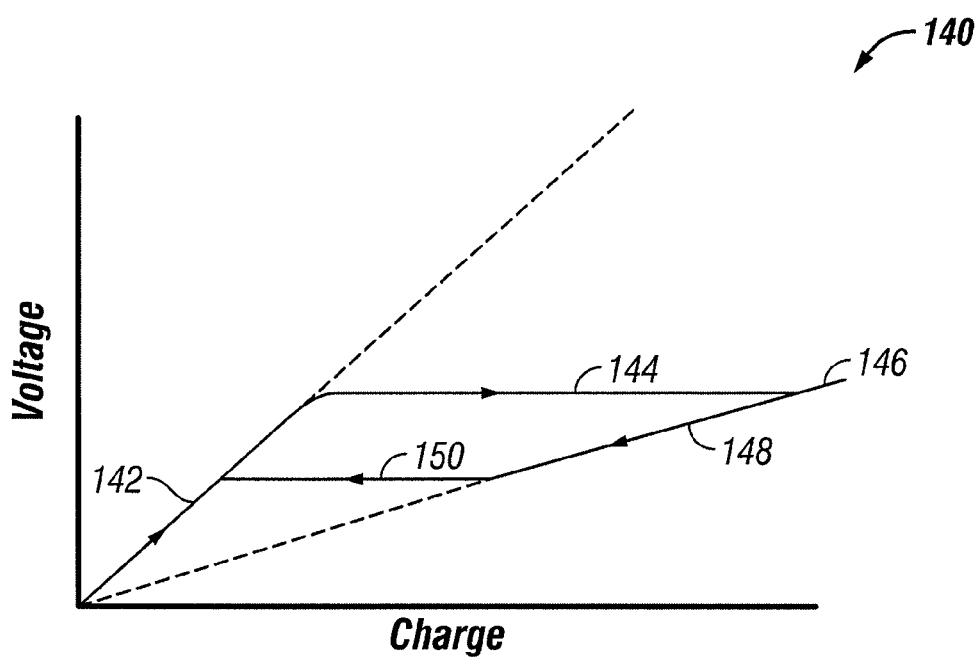
FIG. 11A is a plot of voltage versus charge during actuation and relaxation of an interferometric modulator array.

In one embodiment, the interferometric modulator 136 shown in FIG. 10 may be an array of interferometric modulators arranged in parallel. FIG. 11A is a plot 140 of voltage across such an array of interferometric modulators as a function of charge. When a voltage sufficient to drive the interferometric modulators to a collapsed state is provided via voltage source 132, the voltage across the interferometric modulators increases as charge accumulates, as can be seen in section 142 of the plot. Once the actuation voltage is reached, one or more of the interferometric modulators in the array will begin to actuate. As discussed above, the voltage across a large array (e.g. greater than 100 interferometric modulator elements) of interferometric modulators will remain substantially constant during this actuation period 144, as the overall charge on the interferometric modulators is increasing and actuating interferometric modulators pull charge from other non-actuating interferometric modulators. Once the array of modulators have all actuated, the voltage continues to increase, as can be seen in section 146 of the plot.

When the voltage is removed, and the charge on the interferometric modulators decreases, the voltage across the interferometric modulators decreases until the release voltage is reached, as can be seen in region 148. As the modulators successively release, the voltage remains substantially constant as the charge decreases, as can be seen in region 150. Once the array of modulators have all released, the charge continues to dissipate.

Figure 11B:
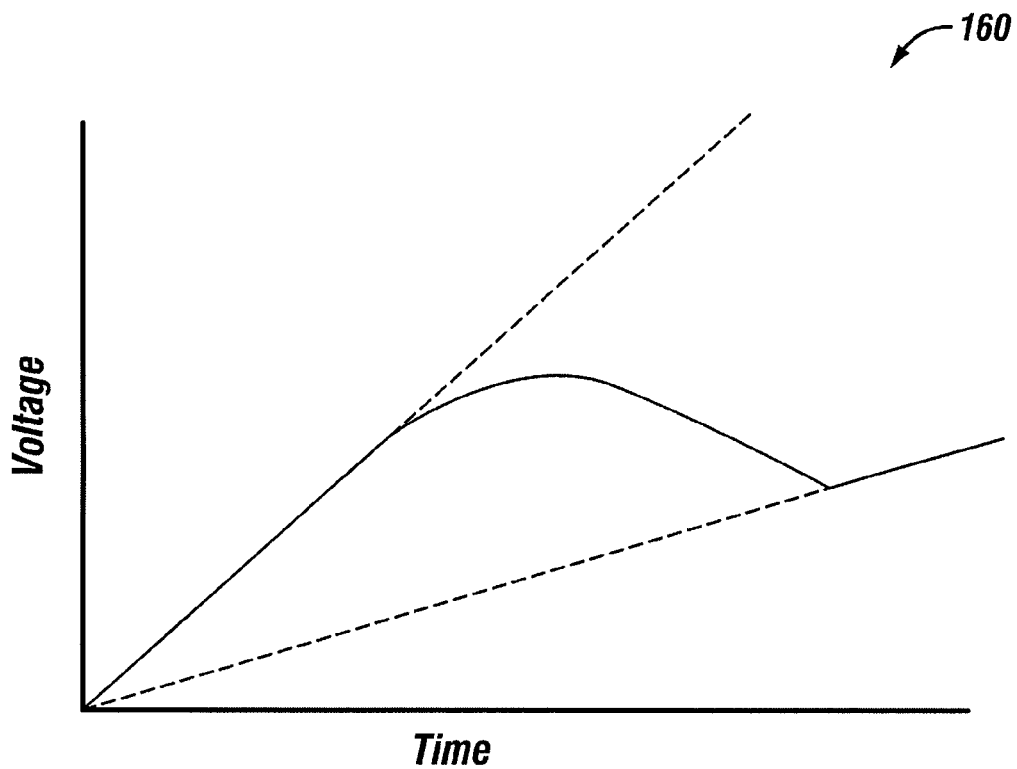
FIG. 11B is a plot of voltage versus time during actuation of a small number of interferometric modulators.

In an embodiment in which there are relatively few interferometric modulators within the array, such as an array with ten or fewer interferometric modulators, or only a single interferometric modulator, the voltage across the interferometric modulator during actuation may not remain substantially constant, but may instead decrease slightly during actuation before continuing to increase after actuation. A plot 160 of voltage across an interferometric modulator as a function of time is shown in FIG. 11B. It can be seen from the figure that the increase in voltage is initially steep, as the capacitance of the unactuated interferometric modulator is lower than the capacitance of the actuated interferometric modulator. After an actuation period during which the voltage decreases somewhat, the voltage continues to increase. After actuation, the increase is less steep than when the interferometric modulator was unactuated, as the capacitance is higher in the actuated state than in the non-actuated state.

Figure 12A:
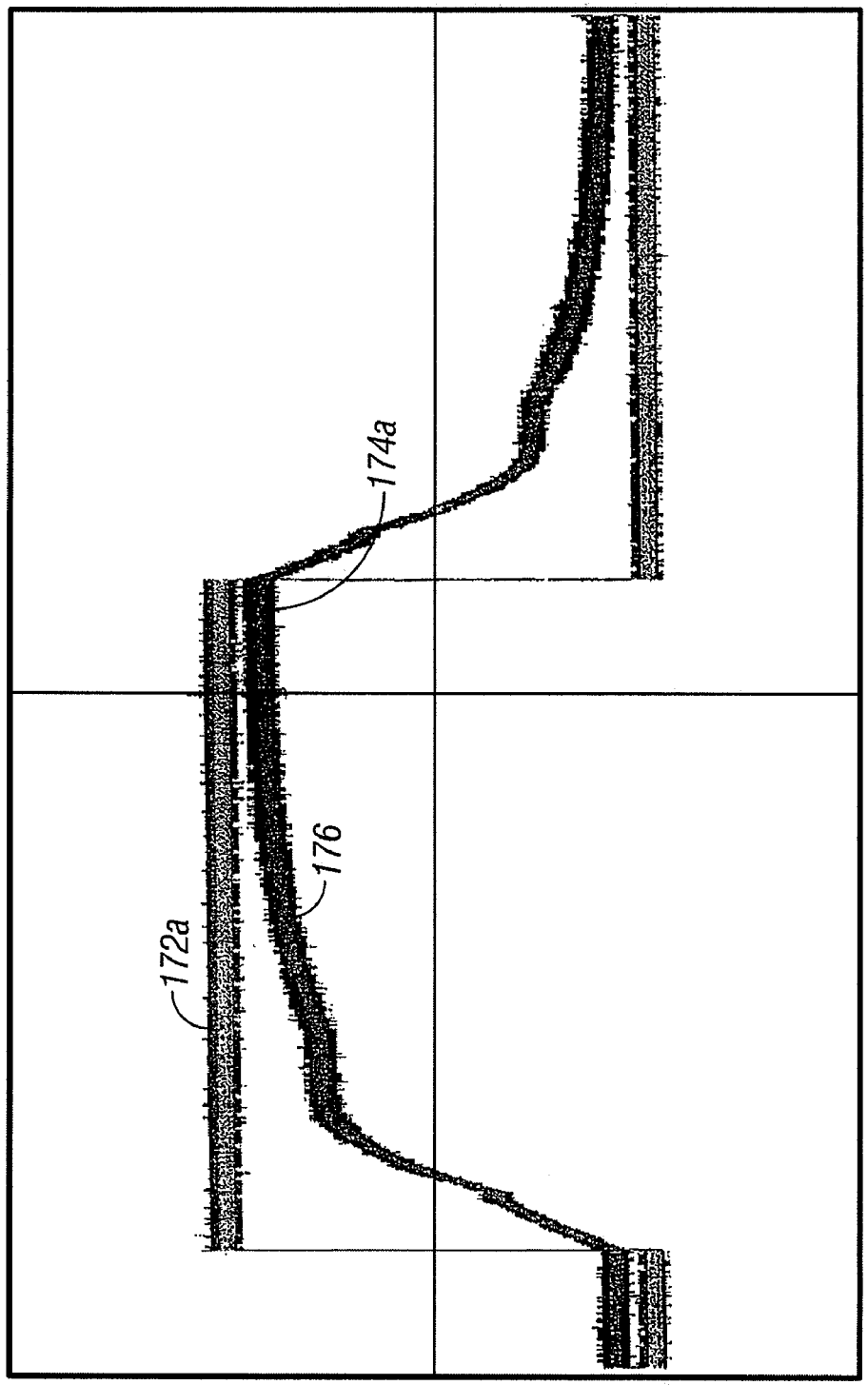
FIG. 12A is a plot of a square driving voltage and a measured voltage across an interferometric modulator, where the driving waveform spans the positive hysteresis window of the interferometric modulator.
Figure 12B:
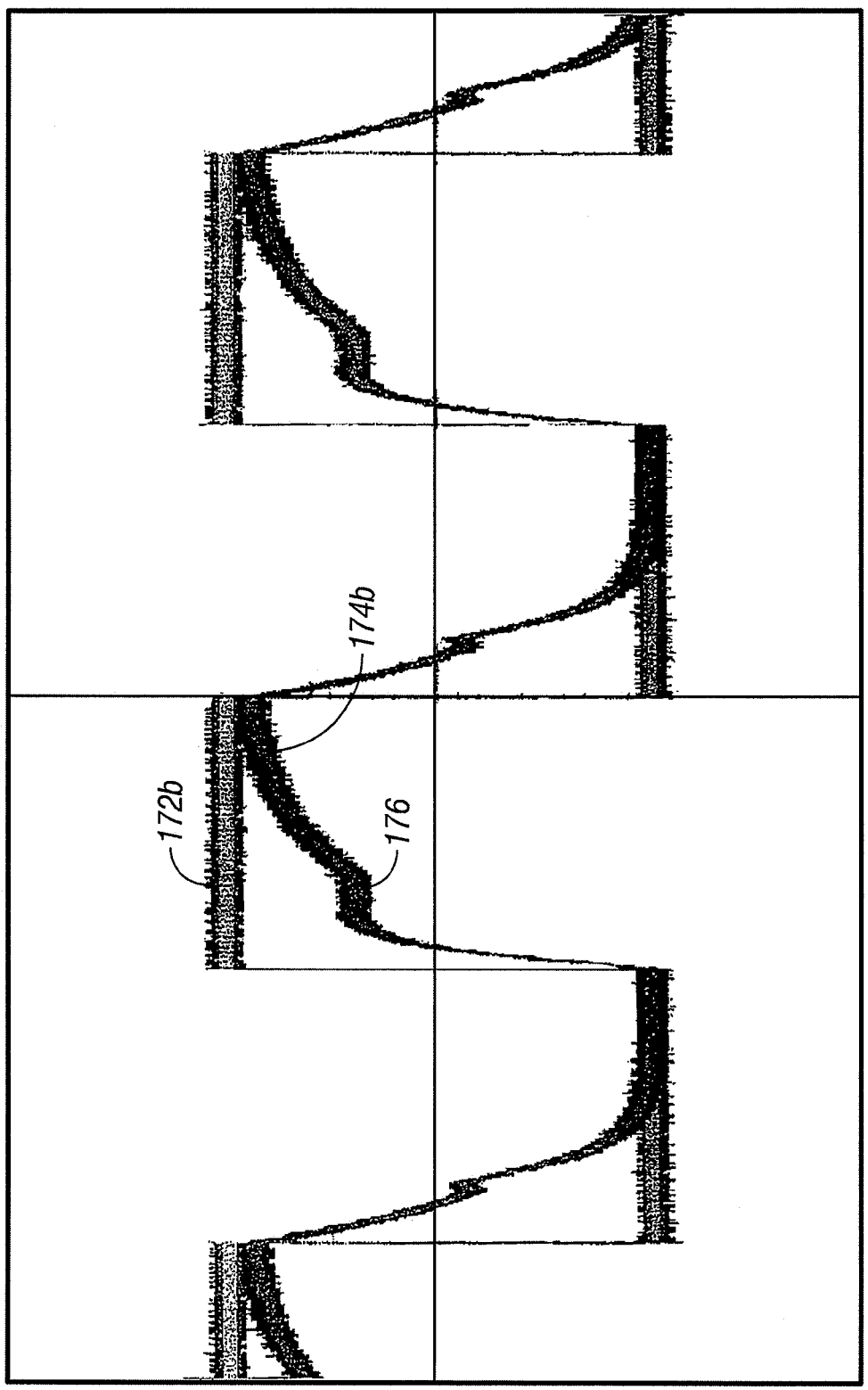
FIG. 12B is a plot of a square driving voltage and a measured voltage across an interferometric modulator, where the driving waveform spans both the positive and negative hysteresis windows of the interferometric modulator.

FIGS. 12A and 12B are plots of voltage as a function of time over a large array of interferometric modulators driven in parallel, where a large resistor is placed in series with the array. In certain embodiments, such an resistor may have a resistance of 1 MΩ, although resistors having a higher or lower resistance may be used, and multiple resistors may be used to provide a desired level of resistance. In FIG. 12A, the square driving waveform 172a spans both the positive and negative hysteresis windows of the interferometric modulator, and the measured voltage response is shown as signal 174a. In FIG. 12B, the driving waveform 172b spans only the positive hysteresis windows of the interferometric modulators, and the measured voltage response is shown as signal 174b. In both cases, periods of substantially constant voltage over time such as sections 176 of the figures are indicative of transition voltages, as discussed above.

Figure 12C:
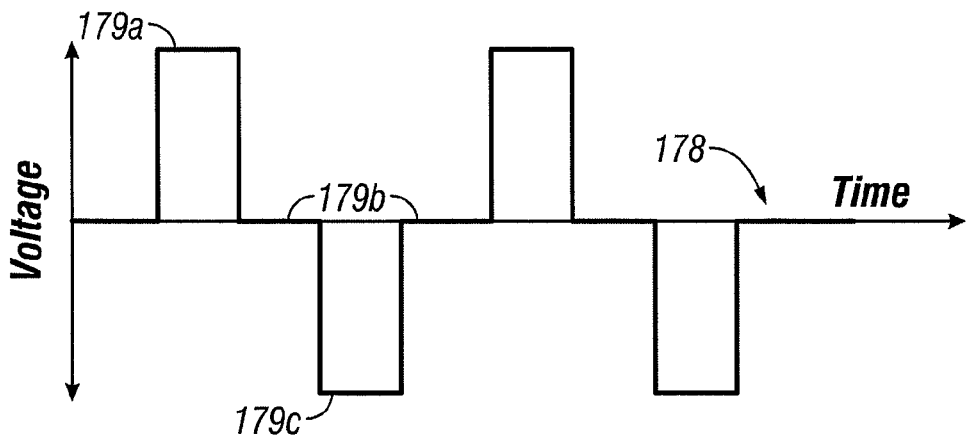
FIG. 12C is a plot of an alternative driving voltage in which the voltage remains substantially constant for periods of time at three distinct voltages.

FIG. 12C illustrates an alternate driving signal 178 which may be used in such an embodiment. The signal 178 alternates between an upper voltage 179a which may be greater than the positive actuation voltage of the interferometric modulator, a bias voltage 179b which may be between the positive release voltage of the interferometric modulator and the negative release voltage of the interferometric modulator, and a lower voltage 179c which may be lower than the negative actuation voltage of the interferometric modulator. In such an embodiment, the driving voltage will span both the positive hysteresis window and the negative hysteresis window of the interferometric modulator, and may facilitate the identification of release voltages, as the voltage remains at the bias voltage for an extended period of time, in contrast to the driving signal 172a of FIG. 12A. In certain embodiment, the bias voltage may be substantially zero, but any suitable bias voltage may be used.

Current Measurement

In another embodiment, the current through an interferometric modulator can be measured and analyzed in order to characterize the dynamic behavior of the interferometric modulator. As a movable membrane or layer of an interferometric modulator moves upon application of a suitable stimulus, the capacitance of the interferometric modulator changes according to the position of the movable membrane with respect to other conducting membranes, which may be fixed conducting membranes. The change of capacitance will result in the generation of current through a suitably chosen circuit when a non-zero voltage is applied across the interferometric modulator. The current as a function of time may be monitored and used to determine information such as the position of the movable membrane as a function of time.

Figure 13A:
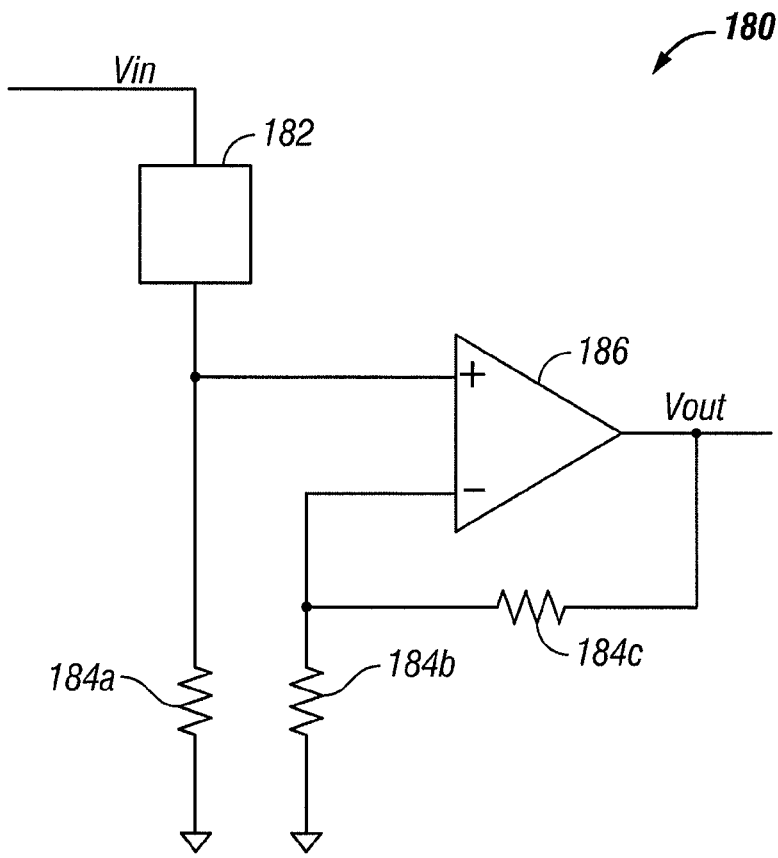
FIGS. 13A-13C are schematic diagrams of electrical circuits which may be used to characterize interferometric modulators.
Figure 13B:
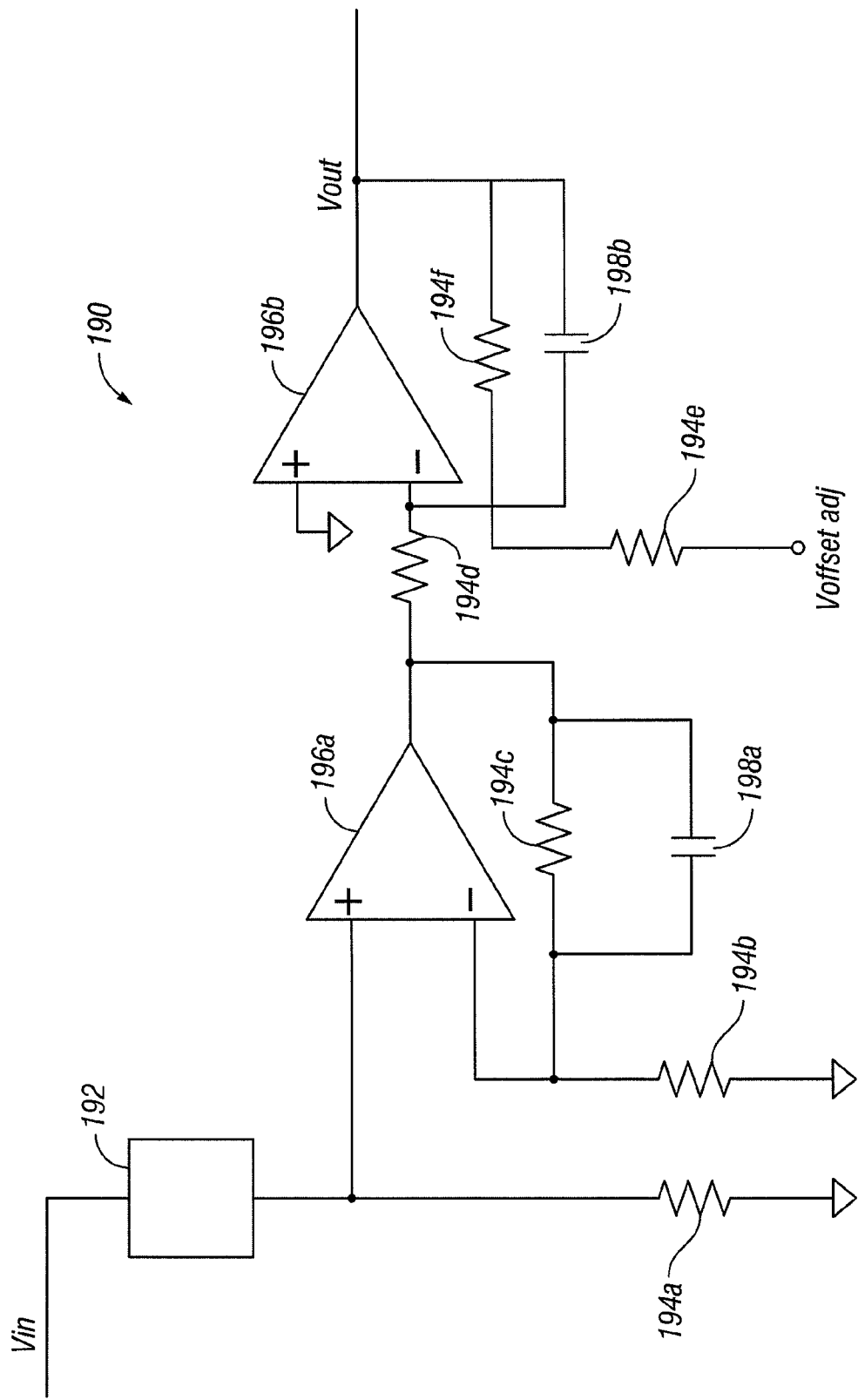
Figure 13C:
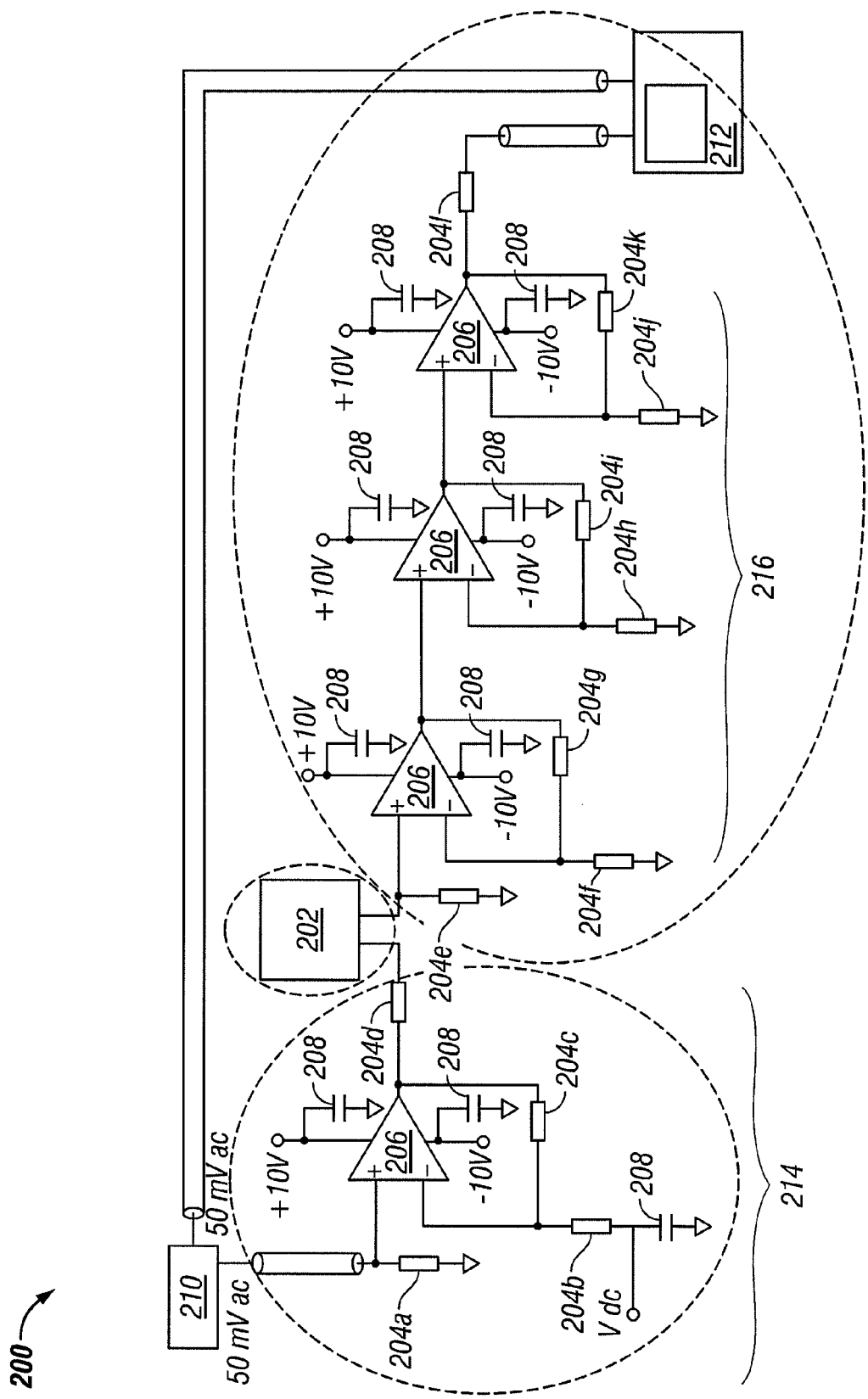

In certain embodiments, a trans-impedance amplifier may be used to measure current by converting an input current to a voltage output proportional to the input current. The voltage signal can then be recorded, and because the relationship between the input current and the voltage output are known based upon design of the trans-impedance amplifier, the current as a function of time can readily be determined. FIGS. 13A, 13B, and 13C illustrate various circuit designs which may be utilized in such a characterization process.

FIG. 13A schematically illustrates a circuit 180 comprising an interferometric modulator 182, resistors 184a, 184b, 184c, and an amplifier 186. In a particular embodiment, resistors 184a and 184b may comprise 1Ω resistors, resistor 184c may comprise a 260Ω resistor, and amplifier 186 may comprise an Analog Devices AD8041 amplifier, although other suitable value or components may also be utilized, and may depend upon expected characteristics of the interferometric modulator 182.

Circuit 180 functions as a non-inverting operational amplifier with gain. Output from the interferometric modulator 182 is applied to the non-inverting input of operational amplifier 186. The gain of this circuit is formulated by the voltage divider feedback network, and is given by Vout=Vin(184B+184C)/184B, where 184B and 184C are the resistances of resistors 184b and 184c, respectively.

FIG. 13B schematically illustrates an alternative circuit 190 comprising an interferometric modulator 192, resistors 194a, 194b, 194c, 194d, 194e, 194f, amplifiers 196a and 196b, and capacitors 198a and 198b. In a particular embodiment, resistors 194a and 194b may comprise 27 kΩ resistors, resistor 194c may comprise a 260 kΩ resistor, resistor 194d may comprise a 200 kΩ resistor, resistor 194e may comprise a 1 kΩ resistor, resistor 194f may comprise a 15 kΩ resistor, amplifiers 196a and 196b may comprise Analog Devices AD8041 amplifiers, capacitor 198a may comprise an 8.2 pF capacitor, and capacitor 198b may comprise a 100 pF capacitor, although other suitable values or components may also be utilized.

Circuit 190 is a two-stage amplifier circuit, where the interferometric modulator is connected to amplifier 196a, which forms the first stage of the integrator circuit. The second stage of the amplifier circuit, which includes amplifier 196b, allows for voltage offset adjustment in order to set a precise zero voltage point, as the output of stage 2, shown as Vout, will be non-zero even when no voltage is applied across interferometric modulator 192.

FIG. 13C schematically illustrates another alternative circuit 200 comprising an interferometric modulator 202, resistors 204a-204l, amplifiers 206, capacitors 208, signal generator 210 and signal analysis module 212 (e.g., an oscilloscope or other signal analysis circuitry and/or logic). In a particular embodiment, resistors 204a and 204f may comprise 51Ω resistors, resistors 204b and 204c may comprise 680Ω resistors, resistors 204d and 204l may comprise 8.2Ω resistors, resistor 204e may comprise a 1Ω resistor, resistor 204f may comprise a 51Ω resistor, resistors 204g and 204i may comprise 510Ω resistors, resistor 204h may comprise a 62Ω resistor, resistor 204j may comprise a 68Ω resistor, and resistor 204k may comprise a 620Ω resistor. In this embodiment, capacitors 208 may comprise 1 µF capacitors, and amplifiers 206 may comprise Analog Device AD811 amplifiers. Other suitable values and components may also be utilized.

Circuit 200 functions as a two stage circuit. A first stage 214 applies a signal to the interferometric modulator 202, which may comprise a signal applied from signal generator 210 or a signal proportional to Vdc shown in FIG. 13C. A second stage 216 comprises non-inverting operational amplifiers with gain which are used to measure the current through the interferometric modulator 202.

By applying a known voltage pulse defined as a function of time by V(t), the current as a function of time I(t) through the interferometric modulator 202 can be measured, utilizing any suitable measurement apparatus, which may utilize one of the circuits described with respect to FIGS. 13A-13C. The charge as a function of time Q(t) on the interferometric modulator can be determined by integrating the current as a function of time, yielding the following relationship:

$$Q(t) = \int I(t) dt \qquad (4)$$

In many embodiments, the interferometric modulator is operated under damping conditions, where air located between the two layers will have a damping effect on the motion of the interferometric modulators. In other embodiments, however, the interferometric modulator may be operated substantially in a vacuum, so that the damping effect is negligible. When the voltage across the interferometric modulator is increased, the initial current is dependent upon the initial state of the interferometric modulator. Subsequently, during the change of state of the interferometric modulator, the current changes in response to the change of state of the interferometric modulator device.

Figure 14:
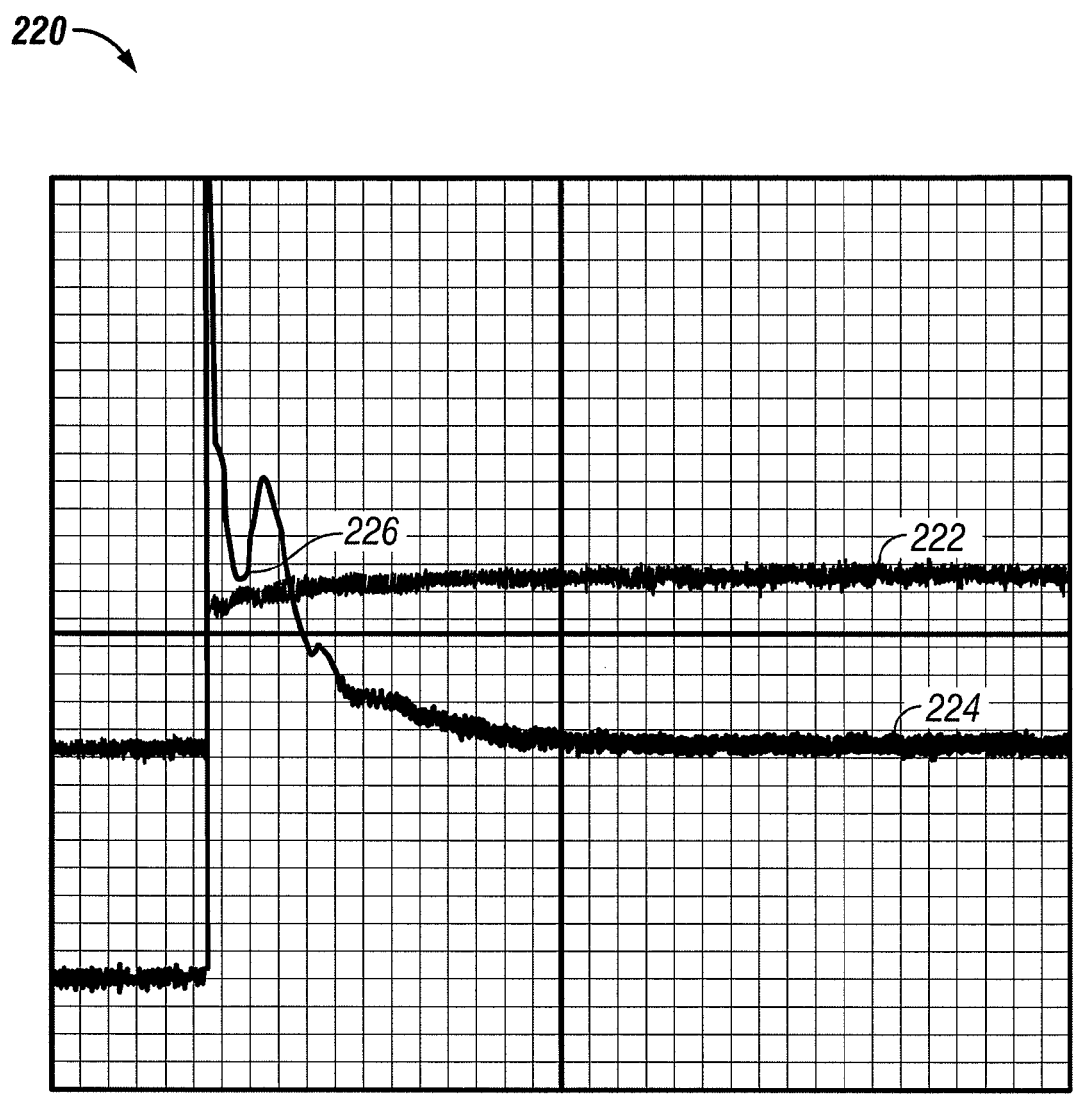
FIG. 14 is a plot illustrating a driving step signal applied to an interferometric modulator, and the measured current in response.

FIG. 14 is a plot 220 illustrating a driving voltage signal 222 and a measured current response 224 for an interferometric modulator as measured on an oscilloscope. To better illustrate the shape of the signal, the vertical scale of the measured current response 224 is extended vertically relative to the driving signal 222 such that each vertical increment represents 2V per division for driving signal 222, while each vertical increment represents 0.5V per division for current response 224. Each horizontal increment represents 0.1 ms for both signals. The driving voltage signal 222 comprises a step function voltage change. Initial application of the driving voltage signal 222 causes a rapid and strong spike in the measured current response 224. Actuation of the interferometric modulator occurs at the first dip 226 in the measured current response 224.

As described further below, integrating the current for the period of time before the interferometric modulator begins to move thus gives a measure of the initial state of the interferometric modulator. Further, integrating the current during the time when the interferometric modulator is moving gives a measure of the dynamic mechanical response of the interferometric modulator. As well, integrating the current for the entire time period gives a measure of the final state of the interferometric modulator.

More generally, given the above relationship between Q(t) and I(t), the capacitance of the interferometric modulator as a function of time is given by the following:

$$C(t) = \frac{Q(t)}{V(t)}. \quad (5)$$

Thus, by dividing by the voltage as a function of time, the capacitance as a function of time can be determined. This can used to calculate the position of the membrane as a function of time x(t), using the following relationship, where $\in_0$ is the permittivity of free space, A is the area of the interferometric modulator, and $d_e$ is the defined as d/k, where d is the height of the dielectric layer and k is the dielectric constant of the dielectric layer:

$$x(t) = \frac{A\varepsilon_0}{C(t)} - d_e = \frac{A\varepsilon_0 V(t)}{\int I(t)dt}, \quad (6)$$

Finally, the above information regarding the dynamic response of the interferometric modulator to an applied signal can be utilized to determine the damping force, which is given by equation (7) below, where the position of the movable layer relative to the upper surface of the dielectric layer or optical stack is given by g(t), where g(t) is related to the position relative to the fixed electrode x(t) by taking into account the thickness d of the dielectric layer overlying the fixed electrode, such that x(t)=g(t)+d. In addition, $V_{offset}$ is the offset voltage, if any, K is the spring constant of the movable membrane, $g_{off}$ is the distance between the dielectric layer and the movable layer when the offset voltage is applied, and m is the mass of the movable membrane:

$$F_{damping\uparrow} = \frac{A\varepsilon_0}{2} \frac{(V(t) - V_{offset})}{(g(t) + d_e)^2} - K(g_{off} - g(t)) + m\frac{d^2 g(t)}{dt^2}, \quad (7)$$

Thus, utilizing only the measured current I(t) and the known driving signal V(t), as well as certain other known or readily determinable physical parameters of the interferometric modulator, the dynamic characteristics of the interferometric modulator can be accurately determined. For instance, the position as a function of time can be utilized to determine, for example, the actuation time of an interferometric modulator. A wide variety of other parameters can be determined in this manner.

Frequency Analysis

In other embodiments, frequency analysis may be performed on measured currents resulting when an interferometric modulator is driven by an input voltage. In certain embodiments, experimental circuit arrangements similar to those of FIGS. 13B and 13C may be utilized to drive the interferometric modulators and measure the resultant current, although a wide variety of suitable circuits may be utilized. Analysis of the measured currents may in some embodiments enable a determination of transition voltages for a MEMS device, and in other embodiments enable determination of a restoring force acting on a movable layer within a MEMS device.

An ideal fixed capacitor will generate a linear response to sinusoidal input. When a sinusoidal voltage, for instance, is applied across an actual fixed capacitor, the resultant current generated by the shifting of charge will be a substantially sinusoidal signal. This can be verified, for instance, by performing a Fast Fourier Transform (FFT) to translate the current signal to the frequency domain. If there is significant harmonic distortion in the response, then the fixed capacitor behaves in some non-linear fashion. If the response is largely at the driving frequency with little energy at other frequencies, then the fixed capacitor operates in a predominately linear fashion.

For an interferometric modulator driven by a sinusoidal voltage having a range which is within or near the hysteresis window, the driving voltage may produce a non-linear response, due to movement of the movable membrane as the voltage changes. When the applied voltage range is significantly above or below the hysteresis window of the interferometric modulator, the response of the interferometric modulator may be substantially linear.

Figure 15A:
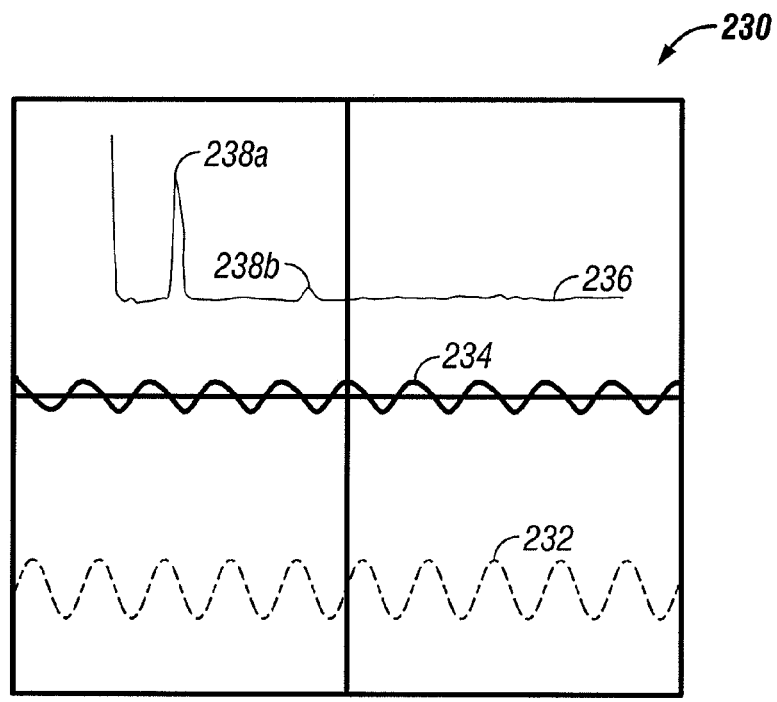
FIG. 15A is a plot illustrating a sinusoidal driving signal applied to an interferometric modulator, a measured current in response, and a Fourier transform of the measured current, where the response of the interferometric modulator is highly linear.

FIG. 15A is a plot 230 illustrating the output of an oscilloscope connected to an appropriate testing circuit, showing a driving sinusoidal voltage 232 and the measured current response 234. Illustrated above the graph is a FFT 236 of the measured current response, performed by the oscilloscope. It can be seen that the FFT 226 includes a large peak 238a at the driving frequency, and a relatively small peak 238b at the third harmonic of the driving frequency. As the frequency response at harmonics of the driving frequency is relatively small or substantially nonexistent as compared to the large peak 238a, the response of the interferometric modulator is substantially linear with little distortion, and it can be determined that the voltage range of the driving signal is outside of the hysteresis range of the interferometric modulator.

Figure 15B:
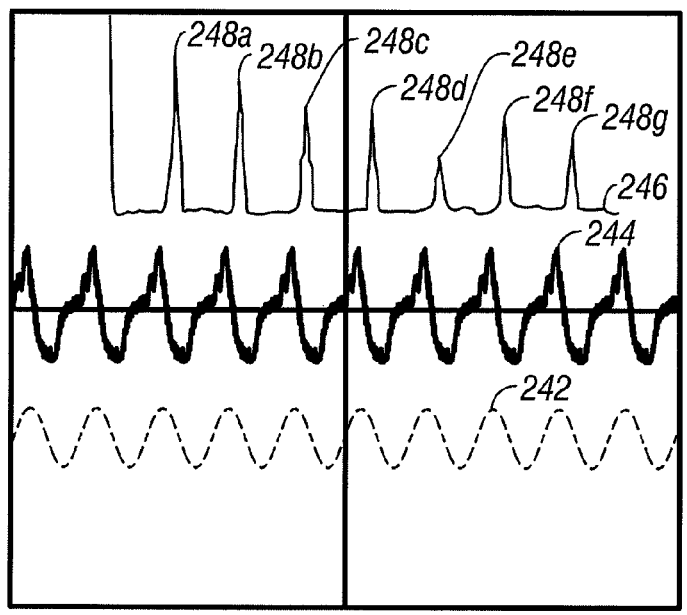
FIG. 15B is a plot illustrating a sinusoidal driving signal applied to an interferometric modulator, a measured current in response, and a Fourier transform of the measured current, where the response of the interferometric modulator is highly non-linear.

FIG. 15B is a plot 240 of the output of an oscilloscope output when another driving sinusoidal voltage 242 is used to drive the same testing circuit used with respect to FIG. 15A, illustrating the measured current response 244. It can be seen that in contrast to the current response 234 of FIG. 15A, which has a smooth sinusoidal shape, the current response 244 of FIG. 15B shows significant distortion. This distortion is evident in the calculated FFT 246 of the measured current response 244, which contains not only the expected peak 248a at the driving frequency, but also several substantially large peaks 248b, 248c, 248d, 248e, 248f, 248g, 248h, at each of the harmonics of the driving frequency. This non-linear response is indicative that at least a portion of the range of the driving voltage is within the hysteresis window of the interferometric modulator.

The height of the second and higher harmonic peaks provide a quantifiable measurement of the non-linearity of the current response of the interferometric modulator. In certain embodiments, the hysteresis window of an interferometric modulator may be approximated by applying a series of sinusoidal driving voltages at different voltage levels and performing a FFT of the measured current. In certain embodiments, the harmonic distortion at certain harmonics of the driving voltage may be determined and compared to threshold levels. Comparing the harmonic distortion to threshold levels can be used to determine whether the voltage range of the driving current is within the hysteresis window of the interferometric modulator.

In other embodiments, frequency analysis of measured current may be utilized to determine the natural resonant frequency of an interferometric modulator. This, in turn, may be utilized to determine the restoring force of a movable layer of the interferometric modulator.

Figure 16:
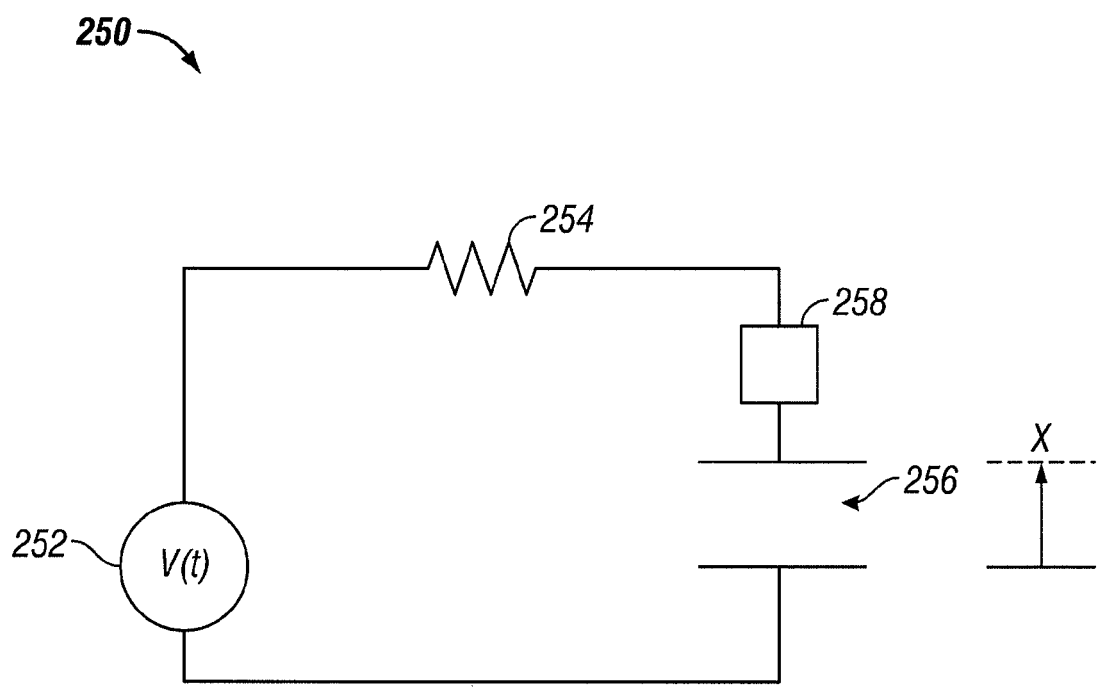
FIG. 16 is a schematic representation of a circuit comprising a voltage source in series with a resistor and an interferometric modulator, where the interferometric modulator is modeled as a parallel-plate capacitor and a spring.

As a first order approximation to understanding its dynamic behavior, an interferometric modulator can be modeled as a spring attached to the top plate of a capacitor. FIG. 16 schematically illustrates such a model 250, where a voltage source 252 is applied across a resistor 254 and an interferometric modulator 256, the movable membrane of the interferometric modulator 256 being supported by a spring 258 having a spring constant $K_s$. The distance from the bottom plate of the capacitor to the top plate is defined as x, the thickness of the dielectric layer (not shown) which sets that minimum gap between the top and bottom plates is defined as d, and the maximum distance from the top plate to the bottom plate is defined as D. The force as a function of position of the top plate, F(x), when a voltage V applied is given by the following equation:

$$F(x) = -\frac{1}{2}\varepsilon_0 A \frac{V^2}{\left[d\left(\frac{1}{k}-1\right)+x\right]^2} + K_s(D-x). \quad (8)$$

If the Taylor series of the above equation is computed around the minimum of energy equilibrium, $x_{min}$, and keeping only the terms up to order (D-x), the following approximation for F(x) is obtained:

$$F(x) \approx -\left(K_s - \frac{\varepsilon_0 A V^2}{\left[d\left(\frac{1}{k}-1\right)+x_{min}\right]^3}\right)(x - x_{min}) \quad (9)$$

For a given V, $x_{min}$ can be obtained from the following equation:

$$V^2 = \frac{2K_s}{\varepsilon_0 A}(D - x_{min})\left[d\left(\frac{1}{k}-1\right)+x_{min}\right]^2. \quad (10)$$

Utilizing the above approximation of F(x), the small-amplitude natural frequency vibration f of the top plate around $x_{min}$ can be defined as follows, where m represents the mass of the top plate:

$$f = \frac{1}{2\pi}\sqrt{\frac{K_s}{m} - \frac{\varepsilon_0 A V^2}{m\left[d\left(\frac{1}{k}-1\right)+x_{min}\right]^3}}. \quad (11)$$

In the absence of air (or other fluid) damping in the cavity between the top plate and the bottom plate, the equations of motion of the top plate and the charge on an interferometric modulator Q(t) may be related via the two following coupled differential equations:

$$-\frac{1}{2}\varepsilon_0 A \frac{\left(V(t) - R\frac{dQ}{dt}\right)^2}{\left(d\left(\frac{1}{k}-1\right)+x(t)\right)^2} + K_S(D - x(t)) = m\frac{d^2 x}{dt^2} \quad (12)$$

$$Q(t) = \varepsilon_0 A \frac{\left(V(t) - R\frac{dQ}{dt}\right)}{\left(d\left(\frac{1}{k}-1\right)+x(t)\right)}. \quad (13)$$

For an unactuated interferometric modulator with no voltage applied at t=0, the following initial conditions may apply: Q(0)=0; x(0)=D; and x'(0)=0. As will be seen with respect to the following figures, the rate at which the voltage is applied can affect the response of the interferometric modulator.

Figure 17A:
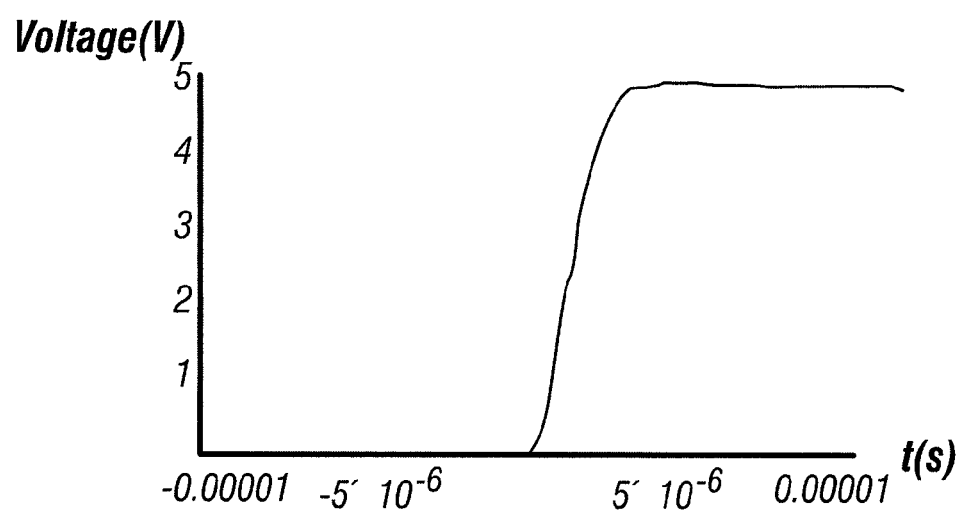
FIG. 17A is a plot of a driving voltage signal as a function of time.
Figure 17B:
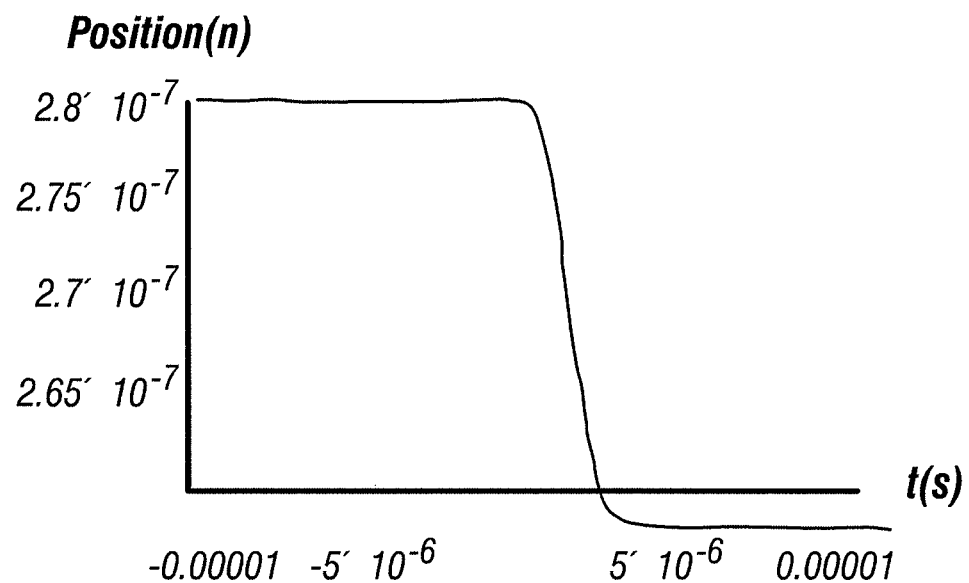
FIG. 17B is a plot of position of an interferometric modulator as a function of time when the driving signal of FIG. 17A is applied.
Figure 17C:
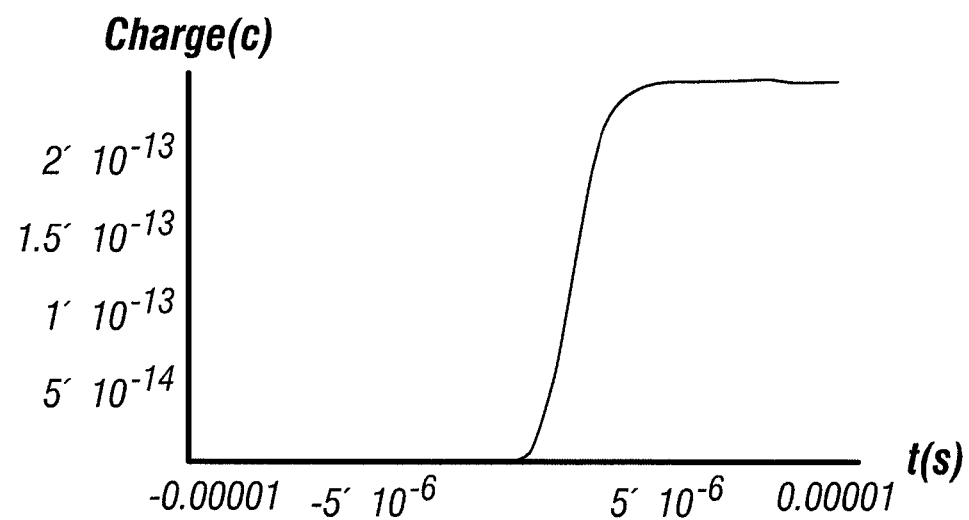
FIG. 17C is a plot of charge on an interferometric modulator as a function of time when the driving signal of FIG. 17A is applied.
Figure 17D:
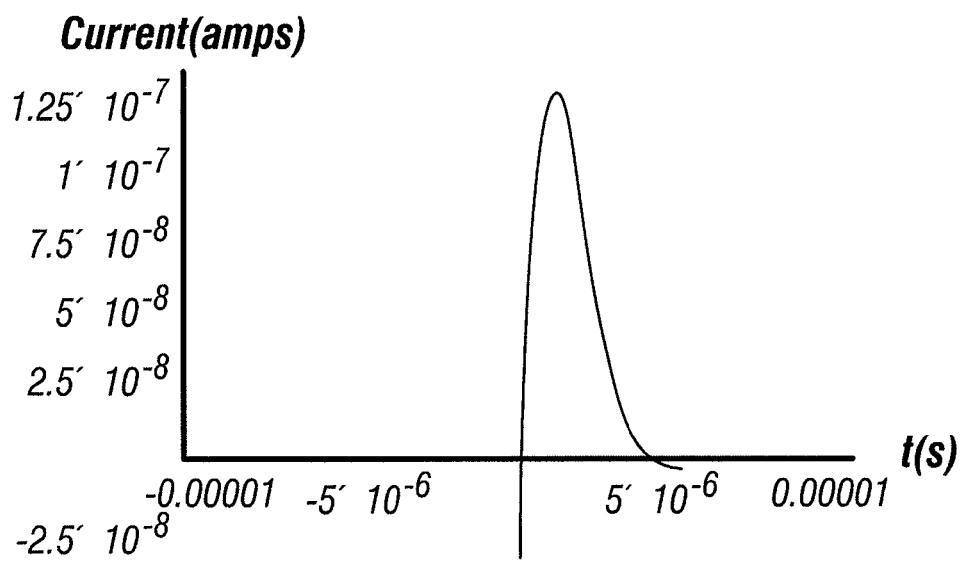
FIG. 17D is a plot of current through an interferometric modulator as a function of time when the driving signal of FIG. 17A is applied.
Figure 17E:
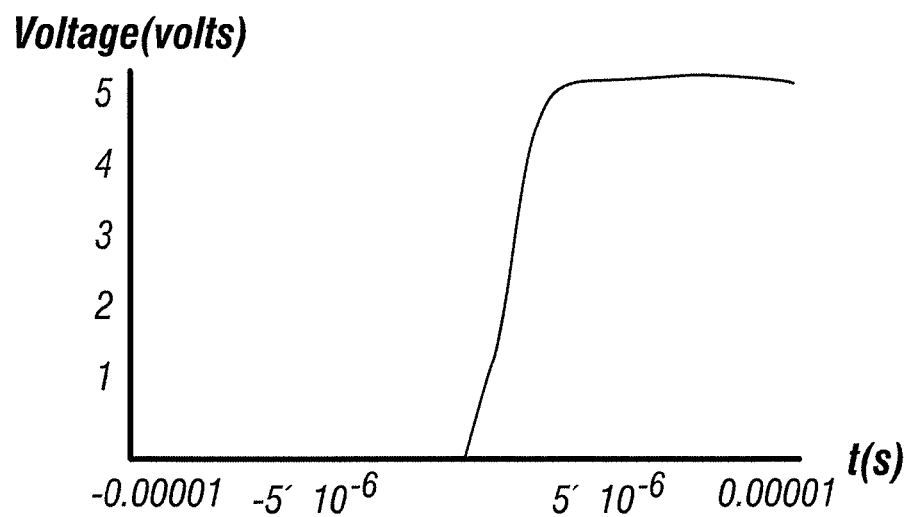
FIG. 17E is a plot of voltage across an interferometric modulator as a function of time when the driving signal of FIG. 17A is applied.

FIG. 17A depicts a driving voltage as a function of time. It can be seen that the voltage increases from 0 to 5 volts in roughly 5 μs. In one embodiment, an interferometric modulator system has the following approximate parameters: D=2, 800 Å, k=4.75, A=1200 μm$^2$, d=500 Å, m=1.4×10$^{-12}$ kg, and R=10,000Ω. When the driving voltage of FIG. 17A is applied to such an interferometric modulator, the position as a function of time is calculated to be that shown in FIG. 17B, the charge on the modulator as a function of time is calculated to be that shown in FIG. 17C, the current as a function of time is calculated to be that shown in FIG. 17D, and the voltage across the interferometric modulator is calculated to be that shown in FIG. 17E. It can be seen that the voltage across the interferometric modulator is substantially similar to the applied voltage, and that the interferometric modulator moves to a stable position $x_{min}$, as can be calculated by equation (10), even in the absence of damping. It can also be seen that the distance traveled by the interferometric modulator is only a small portion of the distance D, so the interferometric modulator is not fully actuated.

Figure 18A:
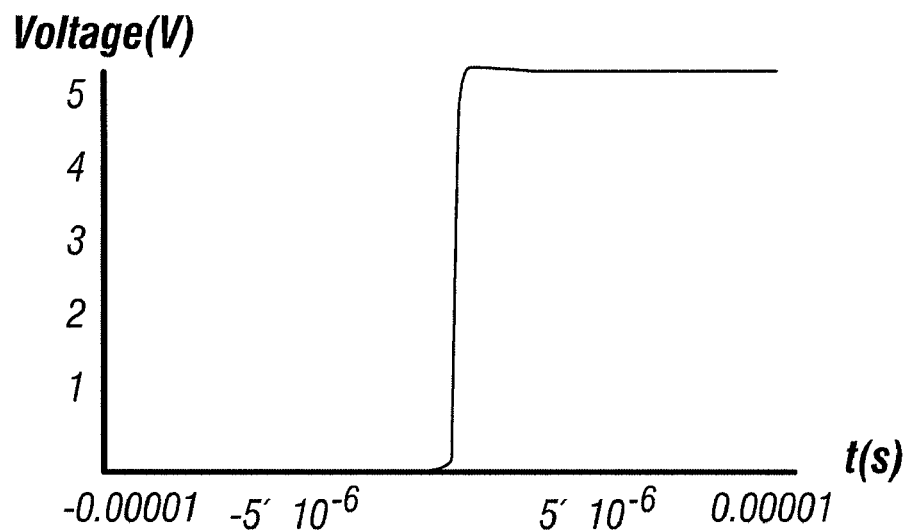
FIG. 18A is a plot of a driving voltage signal as a function of time, where the driving voltage signal increases to the maximum value faster than the driving signal of FIG. 17A.
Figure 18B:
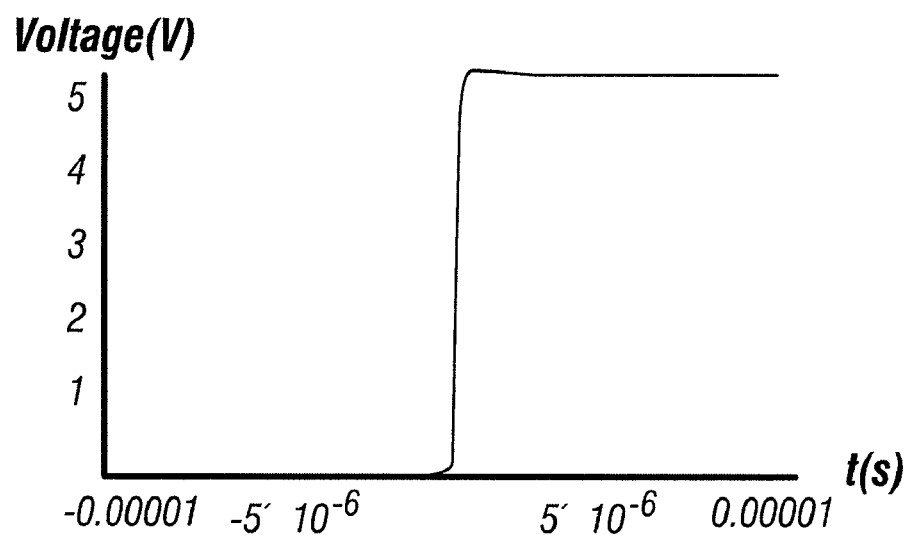
FIG. 18B is a plot of voltage across an interferometric modulator as a function of time when the driving signal of FIG. 18A is applied.
Figure 18C:
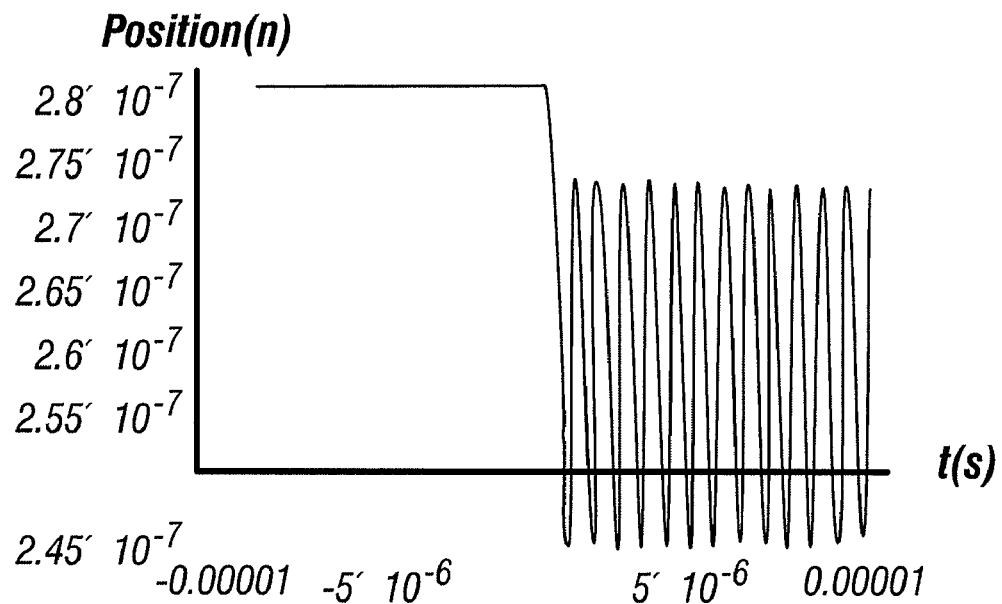
FIG. 18C is a plot of position of an interferometric modulator as a function of time when the driving signal of FIG. 18A is applied.
Figure 18D:
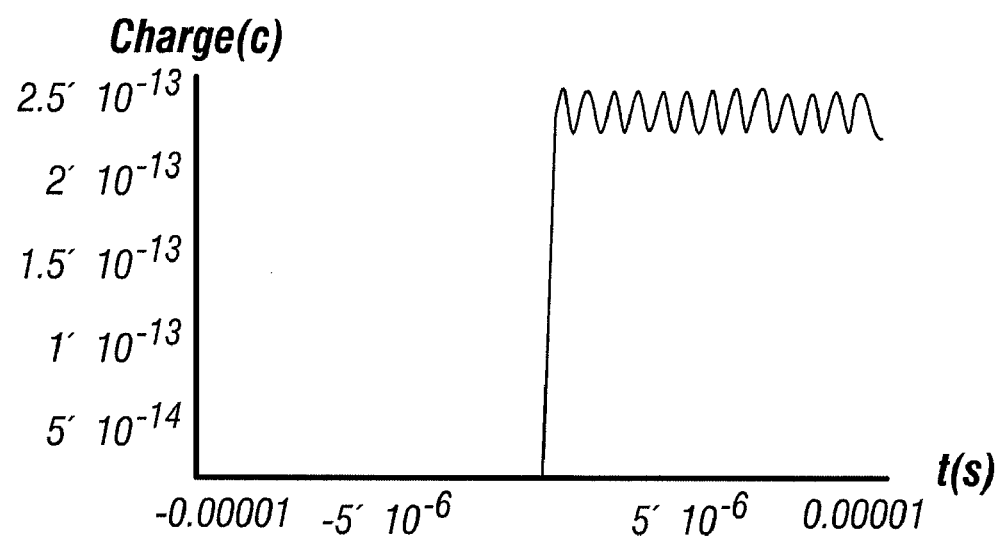
FIG. 18D is a plot of charge on an interferometric modulator as a function of time when the driving signal of FIG. 18A is applied.
Figure 18E:
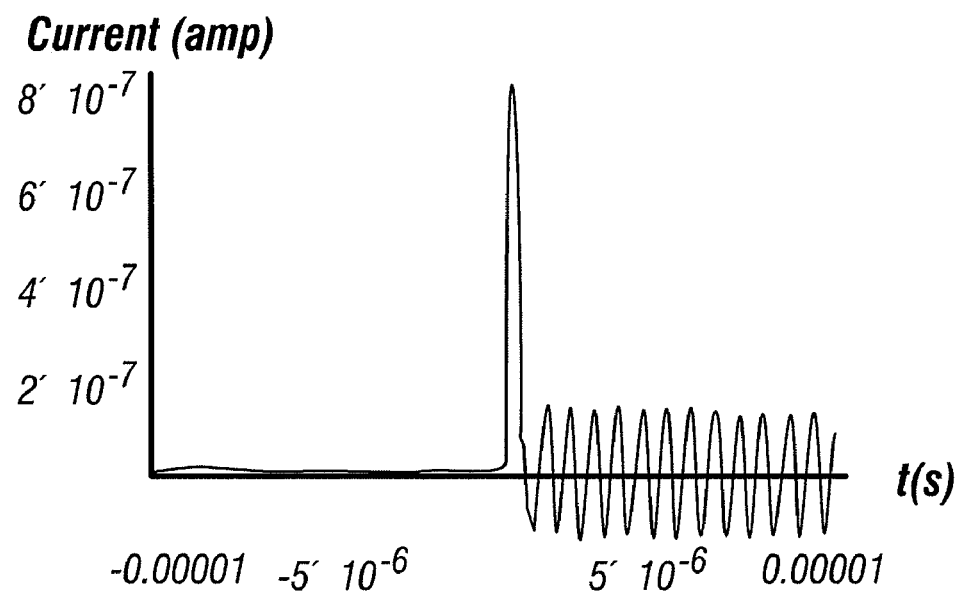
FIG. 18E is a plot of current through an interferometric modulator as a function of time when the driving signal of FIG. 18A is applied.
Figure 18F:
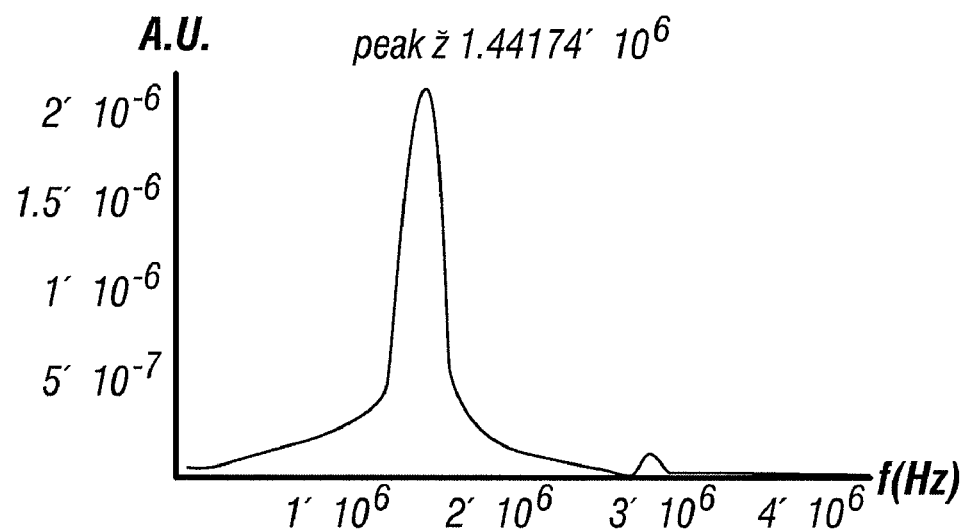
FIG. 18F is a plot of the Fourier transform of the current signal of FIG. 18E.

FIG. 18A depicts an alternative driving voltage as a function of time. As can be seen, although the voltage increases to the same level as the driving voltage of FIG. 17A, the voltage of FIG. 18A increases from 0 to 5 volts in a shorter period of time, in roughly 0.5 μs. FIG. 18B illustrates the calculated voltage across the interferometric modulator, which as before, is roughly the same as the driving voltage. FIG. 18C illustrates the calculated position as a function of time, FIG. 18D illustrates the calculated charge as a function of time, and FIG. 18E illustrates the calculated current as a function of time. It can be seen that, even though the voltage remains constant, the interferometric modulator is oscillating between two positions on either side of $x_{min}$, and continues to do so, due to the lack of damping. FIG. 18F illustrates the Fourier transform of the current, from which the frequency of this oscillation can be readily determined, and which is approximately equal to that predicted by equation (11).

Figure 19A:
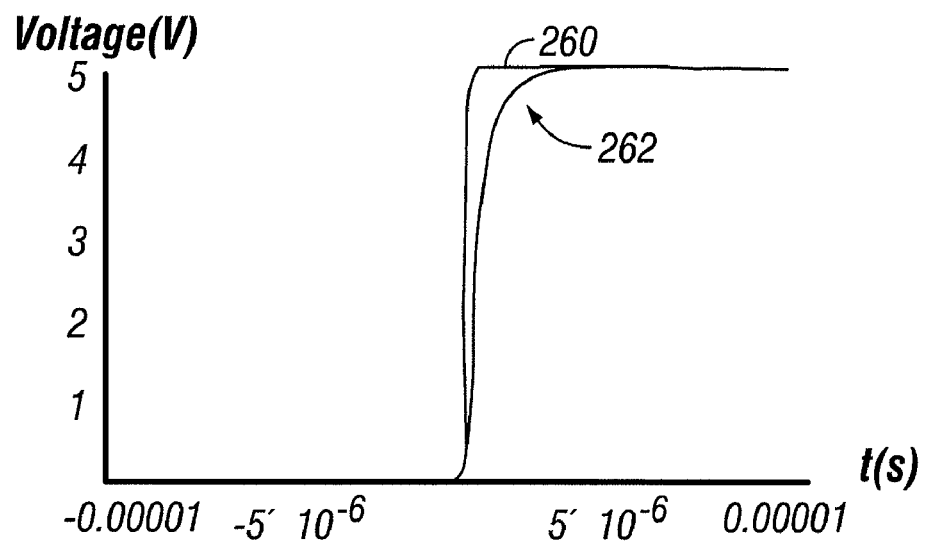
FIG. 19A is a plot of a driving voltage signal and the voltage across an interferometric modulator when the driving signal is applied, where a large resistor is in series with the interferometric modulator.
Figure 19B:
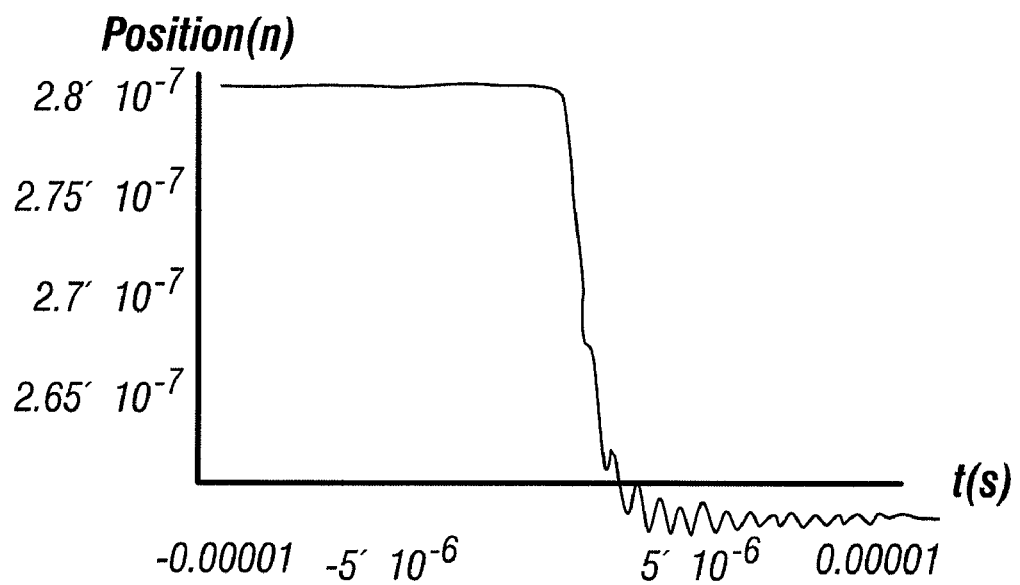
FIG. 19B is a plot of position of an interferometric modulator as a function of time when the driving signal of FIG. 19A is applied.
Figure 19C:
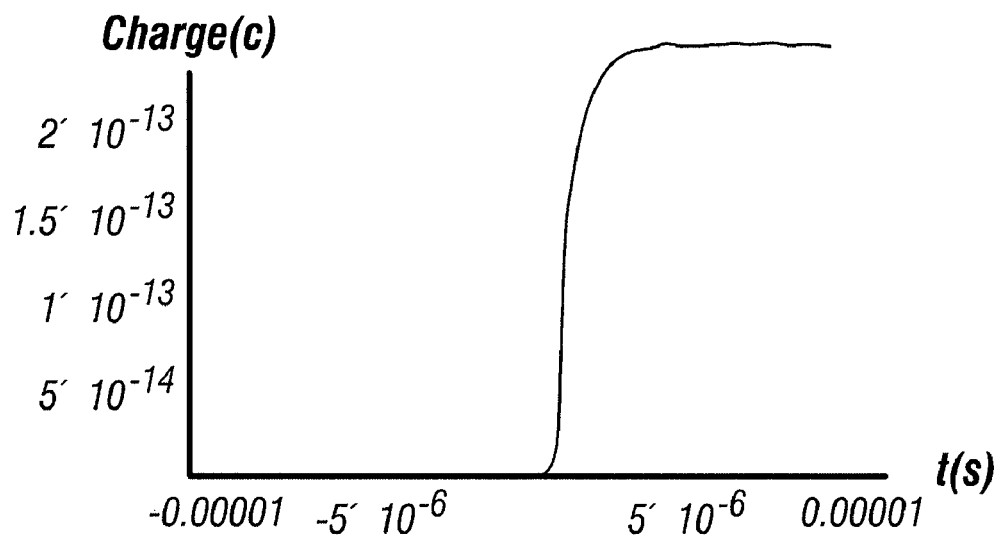
FIG. 19C is a plot of charge on an interferometric modulator as a function of time when the driving signal of FIG. 19A is applied.
Figure 19D:
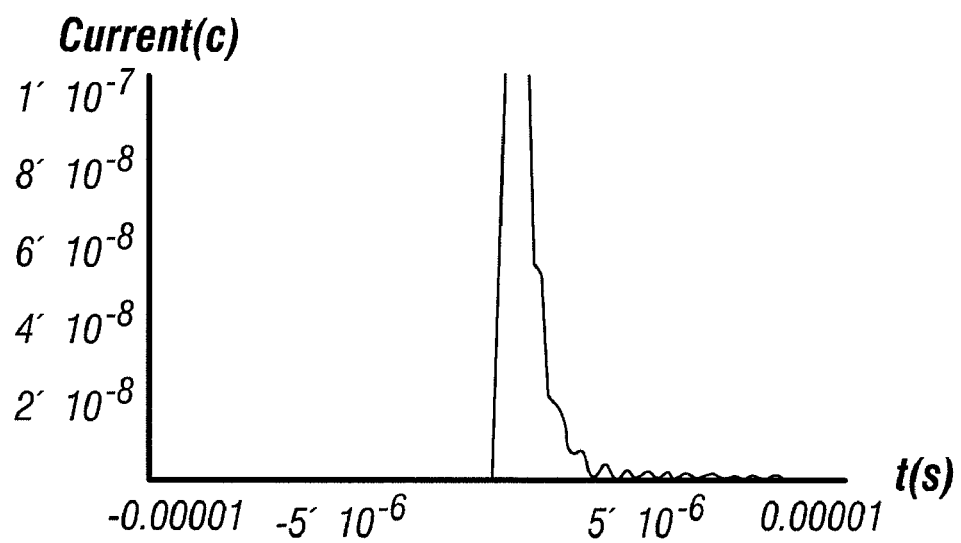
FIG. 19D is a plot of current through an interferometric modulator as a function of time when the driving signal of FIG. 19A is applied.
Figure 19E:
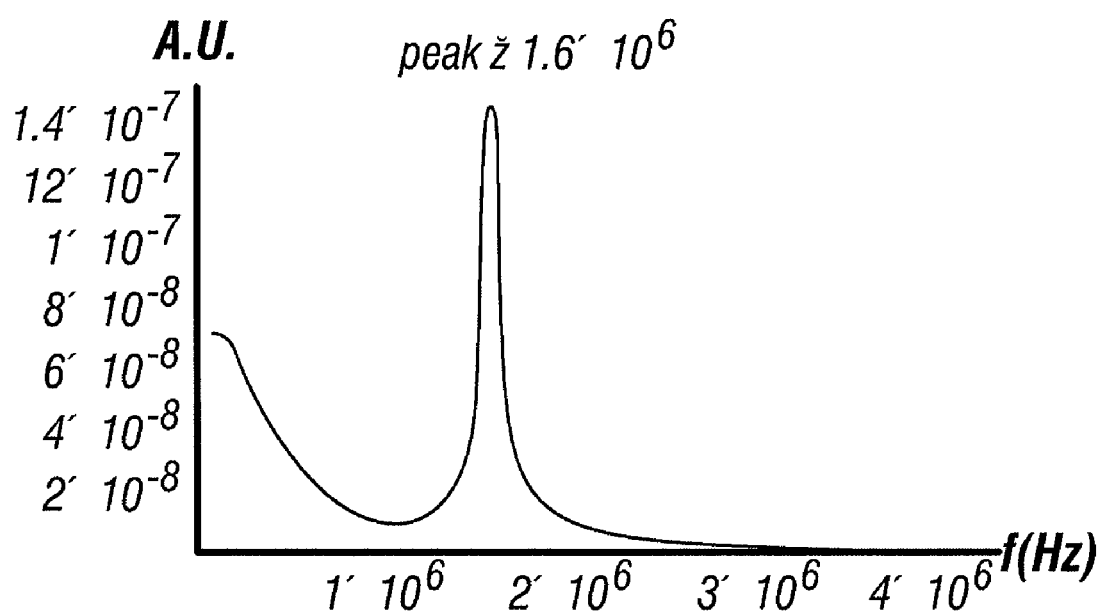
FIG. 19E is a plot of the Fourier transform of the current signal of FIG. 19D.

In another embodiment, the resistance may be increased to 10 MΩ from 10,000Ω. In FIG. 19A, the driving voltage 260 and the measured voltage 262 across the interferometric modulator are shown. It can be seen that, although the driving voltage is similar to the driving voltage of FIG. 18A, the measured voltage in FIG. 19A now lags the driving voltage, due to the increase in resistance and resulting increase in RC time, constant of the circuit. FIG. 19B illustrates the calculated position as a function of time, FIG. 19C illustrates the charge as a function of time, and FIG. 19D illustrates the current as a function of time. In addition to oscillating around the equilibrium state $x_{min}$, it can be seen that the interferometric modulator oscillates even as it is initially moving towards the equilibrium state. The Fourier transform of the current, shown in FIG. 19E, again allows determination of the frequency f.

Figure 20A:
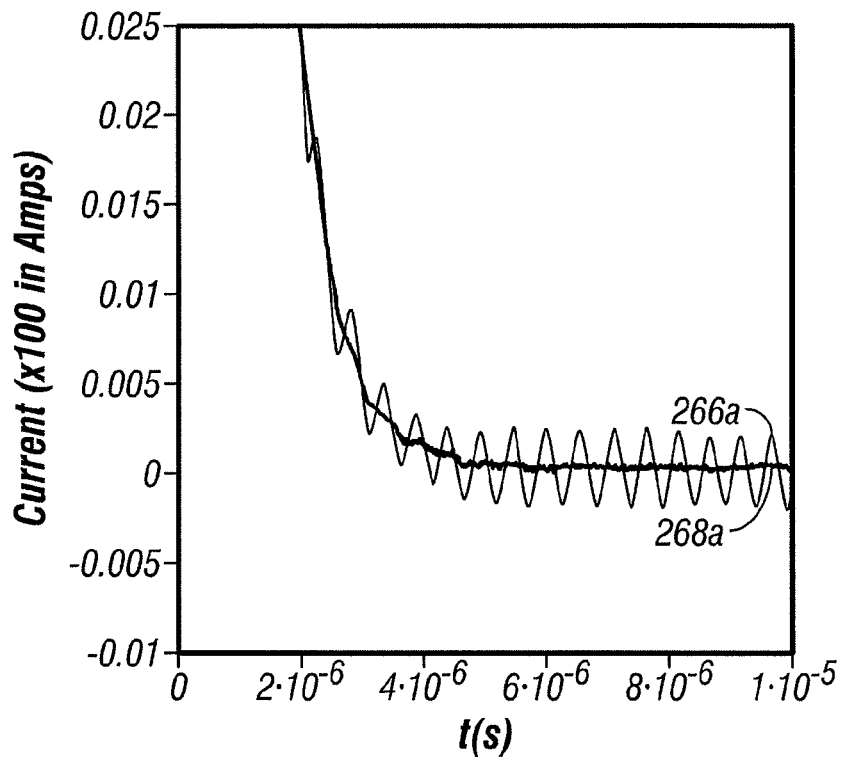
FIG. 20A is a plot of the measured currents through an interferometric modulator as a function of time when actuated in two environments having different atmospheric pressures.

FIG. 20A depicts the current through an interferometric modulator as a function of time during the process of actuation at two distinct pressures. The current response with the interferometric modulator in an evacuated chamber at a pressure of 3×10$^{-5}$ Torr is shown by line 266a, and the current response for the interferometric modulator in a chamber at a pressure of 760 Torr is shown by line 268a. The pronounced vibrations of line 266a are as not as prominent in line 268a, due to the damping effect of the atmospheric pressure air within the chamber on the movable mechanical elements of the interferometric modulator. By performing a Fourier transform of either measured current, information regarding the resonant frequency of the interferometric modulator can be obtained and utilized to determine the restoring force of the movable mechanical elements of the interferometric modulator.

Figure 20B:
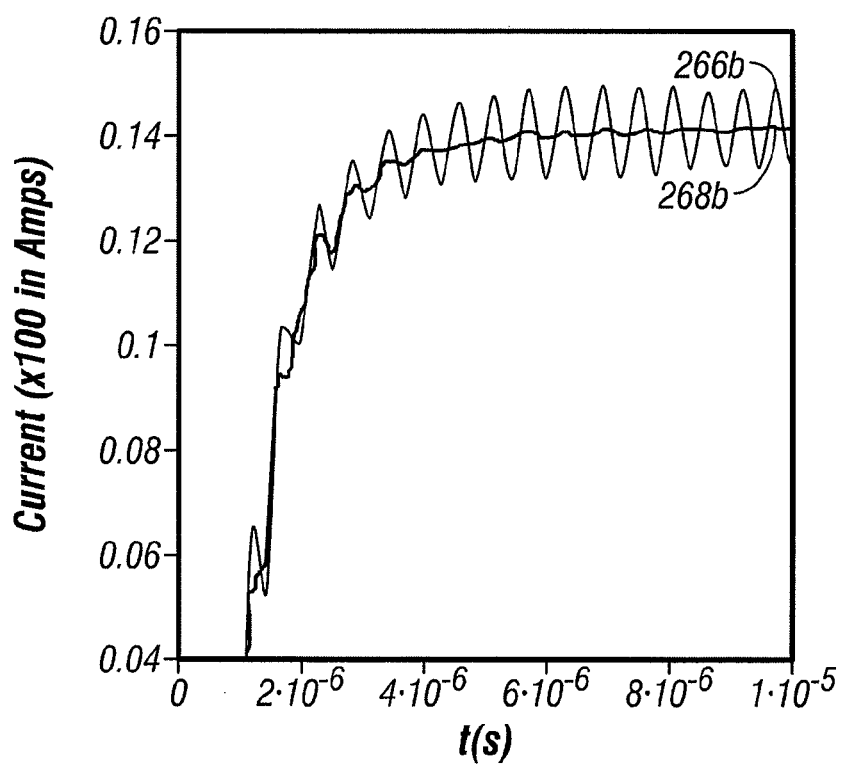
FIG. 20B is a plot of the measured currents through an interferometric modulator as a function of time when released in two environments having different atmospheric pressures.

FIG. 20B depicts the current through an interferometric modulator as a function of time during the process of relaxation from an actuated position at two distinct pressures. The current response for a pressure of $3 \times 10^{-5}$ Torr is shown by line 266b, and the current response for a pressure of one atmosphere is shown by line 268b. In similar fashion to that shown with respect to FIG. 20A, the pronounced vibrations of line 266b are as not as prominent in line 268b, due to the damping effect of the atmospheric pressure air within the chamber on the movable mechanical elements of the interferometric modulator. By performing a Fourier transform of either measured current, information regarding the resonant frequency of the interferometric modulator can be obtained and utilized to determine the restoring force of the movable mechanical elements of the interferometric modulator.

In certain embodiments, circuitry configured to perform the above analysis may be integrated with the driver circuitry of an interferometric modulator device, such as an interferometric modulator display or other MEMS-based display module. Such a display module may comprise a MEMS-based display, such as an interferometric modulator, as well as driver circuitry and testing or monitoring circuitry configured to perform a testing and/or performance characterization method such as the one described above. Analysis of the resonant frequency of the interferometric modulators may be performed as an initial quality control measurement, and/or may be used for ongoing monitoring of the dynamic characteristics of the interferometric modulator, since the restoring force and resonant frequency may change over time, due to a change in operating conditions, may be different between interferometric modulators within an array or across different interferometric modulator arrays, or the like. The analysis may be performed via a test burst, or may be performed during normal activation of the display device. In certain embodiments, one or a small number of the interferometric modulators in an array may be analyzed in this manner. Other changes to the above methods may be made, as well.

Capacitance Measurement

In another embodiment, the capacitance of an interferometric modulator or interferometric modulator array may be measured. In certain embodiments, the circuitry utilized to make such measurements may be integrated into the driver circuitry of an interferometric modulator device, such as an interferometric modulator-based display, although this measurement may be done via any other suitable circuitry, and need not be integrated into driver circuitry.

In one particular embodiment, a periodic electrical stimulus such as a sinusoidal voltage waveform is applied across the interferometric modulator. This signal may be applied by itself, or may alternately be added to a regular drive waveform, which may in certain embodiments be a DC voltage, or any other suitable interferometric modulator drive scheme. This periodic sinusoidal voltage $V_{IMOD}$ may be represented as follows:

$$V_{IMOD} = V_0 \sin(2\pi ft). \tag{14}$$

Because an interferometric modulator acts as a variable capacitor, the current through the interferometric modulator as a functions of time I(t) may be defined as follows, where $C_{IMOD}$ is the capacitance of the interferometric modulator and $V_{IMOD}$ is the voltage across the interferometric modulator:

$$I_{IMOD} = C_{IMOD} \frac{dV_{IMOD}}{dt}. \tag{15}$$

Therefore, the output current resulting from application of the periodic input voltage above across an interferometric modulator will be:

$$I_{IMOD} = 2\pi f C_{IMOD} V_0 \cos(2\pi ft). \tag{16}$$

The resulting current is periodic, having the same frequency as the input voltage, but 90° out of phase with the input signal.

A second signal is also used, resembling the input voltage in shape. In a particular embodiment, the second signal also comprises a cosine term, as in the output current signal, such that the second signal is also orthogonal to the periodic input voltage. In certain embodiments, an appropriate signal with the desired properties may be explicitly generated. In other embodiments, such a signal may be generated using the input signal itself, such as by applying the periodic input voltage across a reference capacitor having a known value, and measuring the resultant output across the reference capacitor. In such an embodiment, the voltage correlation signal $V_{CORR}$ may be given by:

$$V_{CORR} = V_1 \cos(2\pi ft). \tag{17}$$

The second signal can then be correlated with the measured output current through the interferometric modulator to generate a signal which is indicative of the capacitance of the interferometric modulator. In certain embodiments, the correlation may be done through the use of a mixer circuit or a multiplier, and in a particular embodiment, the two signals are multiplied using a mixer, although other embodiments may utilize different operations as necessary. In this embodiment, the mixer has a known gain k, and the voltage output from the mixer is thus given by:

$$V_{MIXER} = k I_{IMOD} V_{CORR}. \tag{18}$$

Where the input voltage and correlation voltage signals are given by the equations above, the voltage output from the mixer in an ideal case is given by:

$$\begin{aligned} V_{MIXER} &= 2\pi f C_{IMOD} k V_0 V_1 \cos^2(2\pi ft) \\ &= 2\pi f C_{IMOD} k V_0 V_1 \left( \frac{1 + \cos^2(4\pi ft)}{2} \right). \end{aligned} \tag{19}$$

In the above equation, it can be seen that the voltage output from the mixer contains both a constant term and a time-varying term. The voltage output from the mixer can be filtered in order to reduce or eliminate the time-varying term, yielding the following:

$$V_{FILTER} = \pi f C_{IMOD} k V_0 V_1. \tag{20}$$

The resultant voltage output from the filter is thus proportional to the capacitance of the interferometric modulator. As the remainder of the terms in the above equation are known, the capacitance of the interferometric modulator can be determined based upon the voltage output from the filter.

When, as above, the correlation waveform is orthogonal to the input voltage signal, the output is proportional to the capacitance even when the measured interferometric modulator is "leaky" and thus has a resistive component in its impedance. In embodiments in which the correlation signal has the same shape as the input waveform, the output is proportional to the resistive component of the impedance of the interferometric modulator. By utilizing various correlation signals, both resistive and reactive measurements of interferometric modulator impedance may be measured. In certain embodiments, through the use of multiple correlation circuits, the resistive and reactive components of interferometric modulator impedance may be simultaneously measured.

As noted above, the periodic input voltage may be applied in conjunction with any drive signal, and the measurement can be made at multiple DC voltage values, such as in conjunction with a DC voltage sweep, in order to determine the capacitance or impedance at various voltage levels. Because interferometric modulator properties such as capacitance may vary depending on the state of the interferometric modulator, capacitance measurements over a variety of DC voltage levels may be made, and then used to identify transition voltages by noting changes in capacitance due to actuation or release of the interferometric modulator.

In other embodiments, the input and correlation voltages may not be sinusoidal signals, but may be any other type of signals, including but not limited to square waves or triangular waves. In particular, when square waves are utilized, appropriate mixers may be provided utilizing only switches, simplifying the circuit design.

Figure 21:
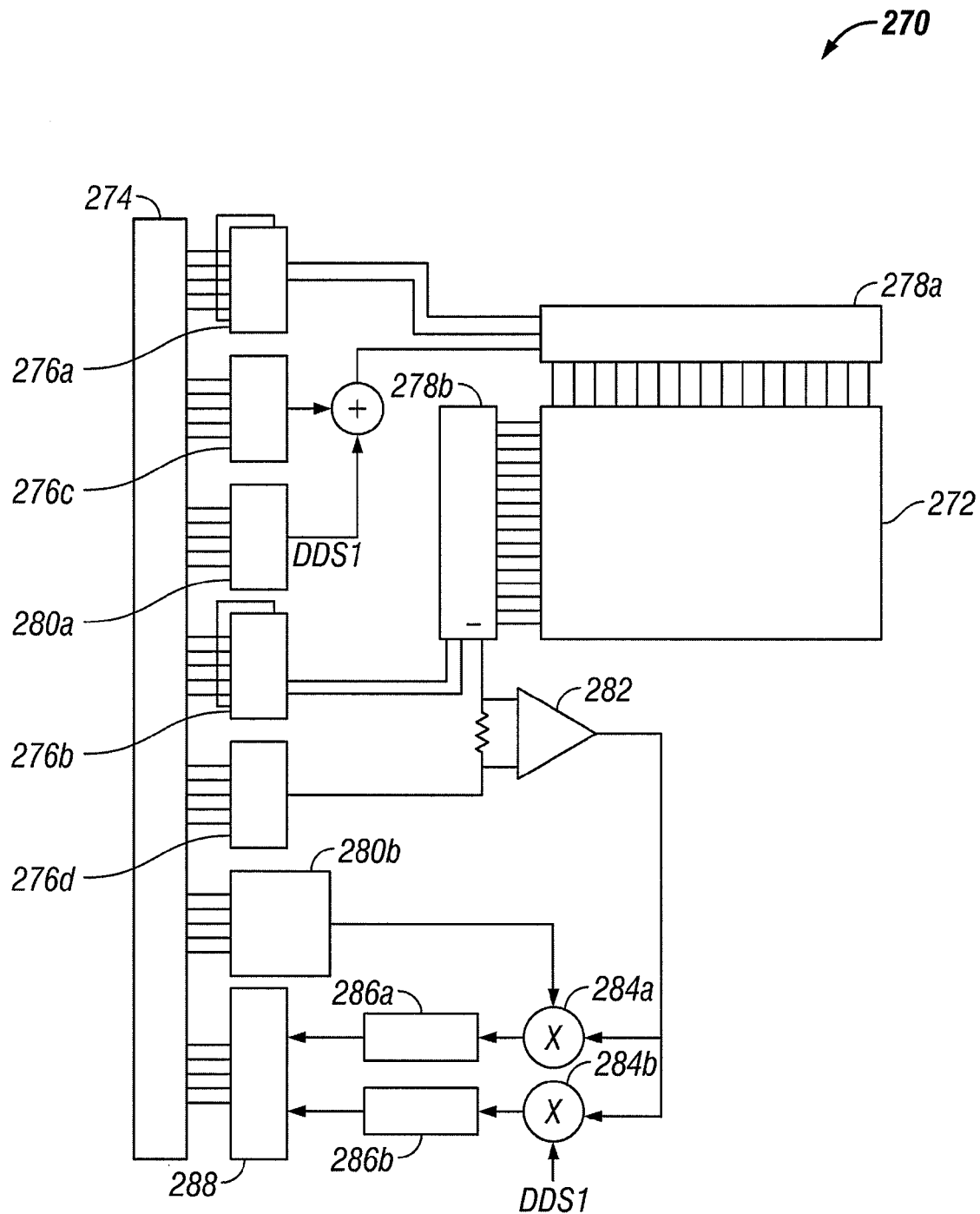
FIG. 21 is a schematic diagrams of an electrical circuit which may be used to both drive and characterize interferometric modulators

FIG. 21 schematically depicts an exemplary circuit 270 which integrates the correlation circuitry with driver circuitry. This circuit may, for example, form a part of a MEMS-based display module. Although discussed here with respect to an interferometric modulator array, other MEMS devices and/or arrays of devices may be utilized, as well. Circuit 270 comprises an interferometric modulator array 272 along with driver circuitry configured to drive the interferometric modulator array 272. Digital logic 274 controls digital-to-analog converters 276a and 276b configured to provide the static (or quasi-static) driving voltages to the interferometric modulator array. Individual rows and columns of the interferometric modulator array may in certain embodiments be addressed via switches 278a and 278b.

In addition to the driver circuitry, circuit 270 comprises additional circuitry, which may be used to, for example, perform the method discussed above. An additional signal, such as the input signal discussed above, may be generated via a direct digital synthesis block 280a may be used to generate an additional signal, which may be used in conjunction with an additional digital-to-analog converter 276c. The current through the interferometric modulator may be measured via a trans-impedance amplifier 282, which may be used in conjunction with a digital-to-analog converter 276d. The output from trans-impedance amplifier may be mixed via mixer 284a with a correlation signal generated by a direct digital synthesis block 280b or by a digital-to-analog converter. As discussed above, a filter 286a may be used to filter the periodic portion of the resultant signal, and an analog-to-digital converter 288 may be used to digitize the filtered or unfiltered resultant signal. In other embodiments, mixer 284b may be used to mix the measured current with, for example, the input signal, and filter 286b may be used to filter the signal.

Other measurements may also be made using the output from the mixer 284b. For example, the output from the mixer multiplied by the current will yield a value indicative of the total power being used by the interferometric modulator. If the output from the filter 286b is multiplied by the current, the result will be a value indicative of the average power utilized by one or more devices of the interferometric modulator array 272. Measurement circuitry configured to determine either actual or average power use may be integrated into devices, particularly mobile devices or other devices where power consumption is important, in order to provide a determination of such information regarding power usage.

Noise Reduction

In another embodiment, spread spectrum techniques may be utilized in the measurement of the capacitance of interferometric modulators, although these techniques may be used in the measurement of other interferometric modulator characteristics, as well. A known input parameter may be applied to a system, and a resultant output signal may be used to determine an output parameter. The output signal is dependent not only on the known input parameter, but also on any undesirable noise or interference in this system, complicating the measurement of the output parameter.

As described above, measurement of the capacitance of an interferometric modulator may be done through the measurement of current, and the capacitance calculated from the resultant current. The resultant capacitance may be used to determine, for example, the hysteresis curve of the interferometric modulator. As the measured current may be affected by noise or interference, a spread-spectrum technique may be utilized to minimize the effect of this noise or interference on the measured current. The output parameter determined using the measured current will be undesirably affected by this noise or interference, making the determined output parameter less accurate.

Figure 22A:
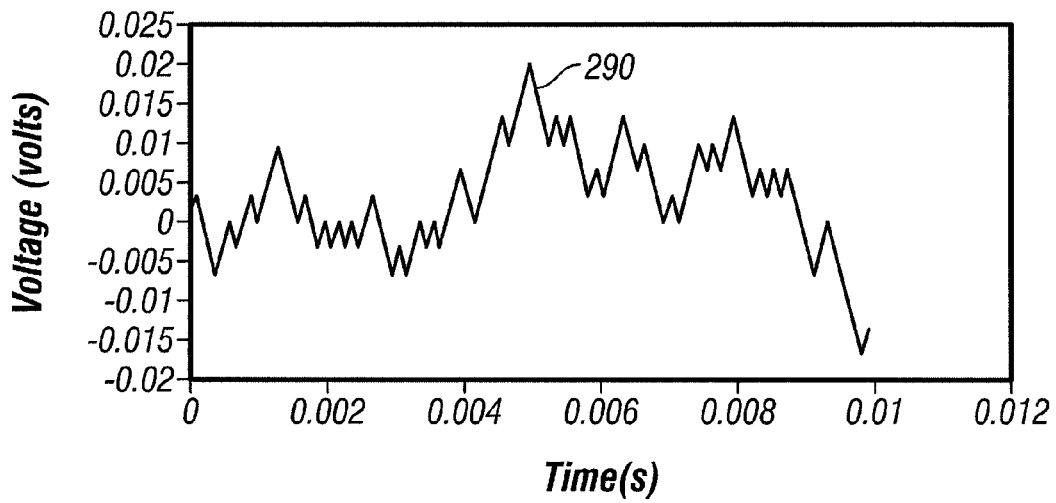
FIG. 22A is a plot of a driving voltage as a function of time, where the driving voltage is modulated with a known random or pseudo-random modulation signal.

In one embodiment, a known signal which has a high amount of randomness is modulated with the driving voltage applied to the interferometric modulator. In certain embodiments, the known signal may be a known pseudo-random signal. In other embodiments, the known signal may be a purely random signal which is measured to obtain a known signal. FIG. 22A illustrates a modulated driving voltage 290 to be applied across an interferometric modulator, wherein the driving voltage has been modulated with a known random or pseudo-random signal.

Figure 22B:
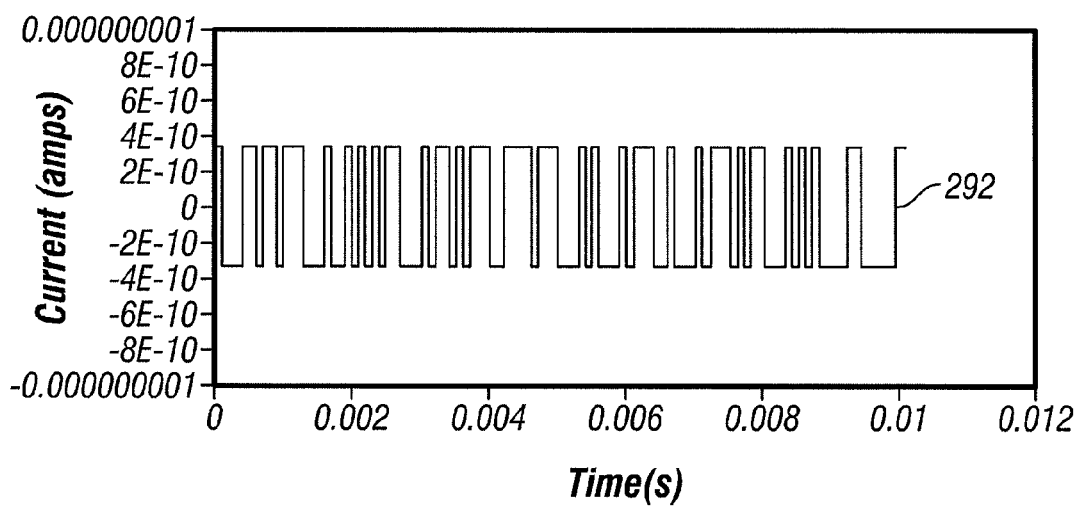
FIG. 22B is a plot of the measured current through an interferometric modulator when the driving signal of FIG. 21A is applied.
Figure 22C:
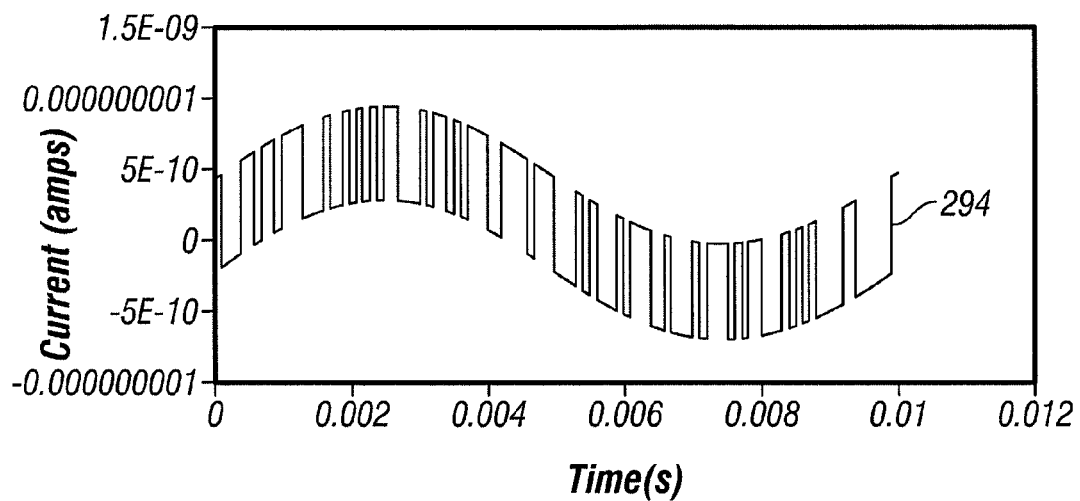
FIG. 22C is a plot of the measured current through an interferometric modulator when the driving signal of FIG. 21A is applied and additive noise is introduced.

In an ideal case in which there is substantially little or no noise or interference, the resultant current through an interferometric modulator when the modulated driving voltage 290 is applied across the interferometric modulator may be given by the ideal resultant current 292 of FIG. 22B. However, in an embodiment in which noise or interference has an effect on the signal, the resultant current may be given by resultant current 294 of FIG. 22B. In the embodiment depicted, artificial noise in the form of a DC voltage and a sinusoidal voltage have been used as additive noise. It can be seen that resultant current 294 has a sinusoidal shape and a DC offset relative to ideal current 292 due to the noise or interference. The particular distortion in a given embodiment may alter the shape of the resultant current in a variety of ways, depending on the cause of the noise or interference, and may be more random in shape and effect.

The resultant current may then be demodulated so as to remove the effect of the known random or pseudo-random signal, and obtain a demodulated signal indicative of the output had the driving voltage not been modulated with the known random or pseudo-random signal. Because the random or pseudo-random modulation signal used to modulate the driving voltage is known, whether by design or measurement, a demodulation signal may be determined based upon the modulation signal, which can be used to remove the effect of the modulation signal. In this case, because capacitance is related to the voltage and the time integral of the current, the time integral of the modulation signal may be determined and used as the demodulation signal.

Figure 22D:
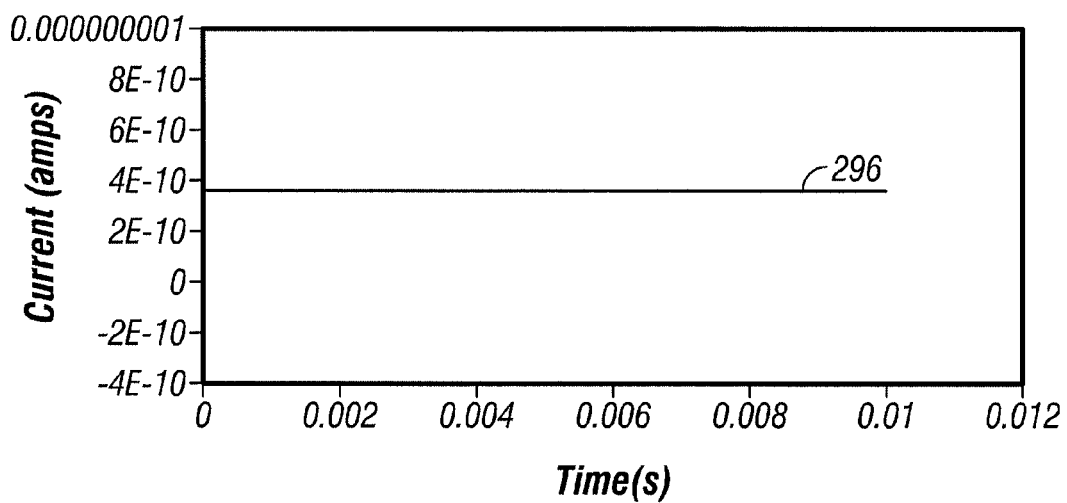
FIG. 22D is a plot of the current of FIG. 21B after demodulation using a signal related to the modulation signal.
Figure 22E:
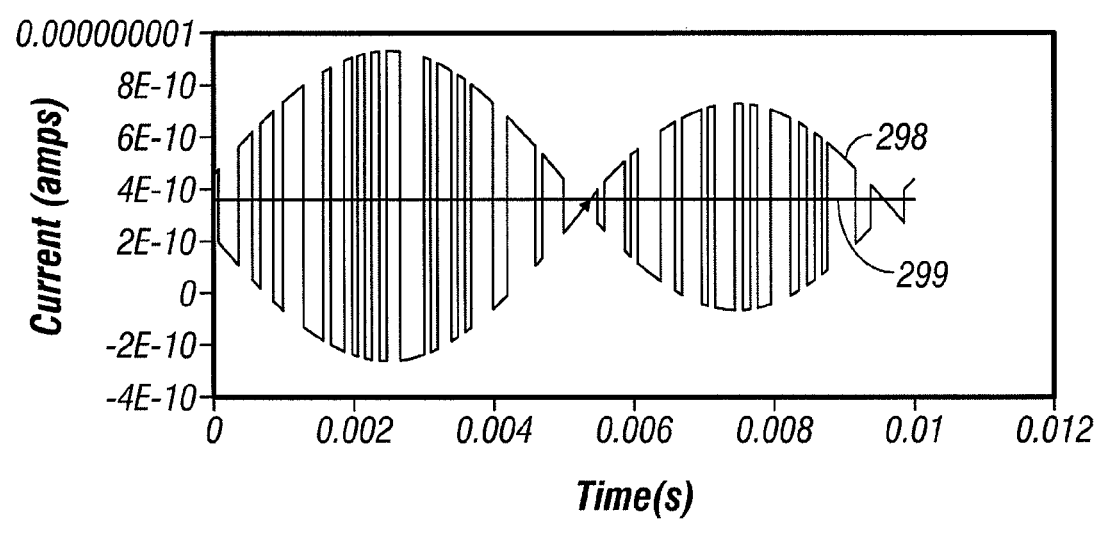
FIG. 22E is a plot of the current of FIG. 21C after demodulation using a signal related to the modulation signal.

FIG. 22D shows an ideal demodulated current 296 resulting from the demodulation of ideal resultant current 292 using the time integral of the modulation signal as the demodulation signal. FIG. 22E shows a noisy demodulated current 298 resulting from demodulation of resultant current 294, as well as the time average 299 of the noisy demodulated current 298. It can be seen that the time average 299 is very close to the ideal demodulated current 296, despite the introduction of additive noise. The time average 299 of the demodulated current 298 provides a measurement which can be used to determine the capacitance of an interferometric modulator.

The use of a known modulation signal, coupled with the use of a demodulated signal directly related to the modulation signal, provides a resultant measurement which is significantly less sensitive to random noise. This resultant current can be used, in conjunction with the driving voltage, to determine the capacitance of the interferometric modulator in a manner similar to those discussed above, as well as to determine other properties of the interferometric modulator.

As discussed above, this method may be performed via components integrated with the driver circuitry of an interferometric modulator array, such as an interferometric modulator display device. In addition, application of unrelated pseudo-random functions for modulation and demodulation does not result in a change to the output. Thus, if multiple such measurements are performed simultaneously within the same system using different orthogonal pseudo-random functions, they do not interfere with each other, permitting multiple simultaneous measurements to be made on the same system. For example, the capacitance of multiple interferometric modulator pixels within an array may be simultaneously measured.

Various combinations of the above embodiments and methods discussed above are contemplated. For instance, spread spectrum techniques may be used in conjunction with a wide variety of other measurements to minimize the effect of noise or interference. In addition, the methods of testing described herein may be used in combination with other methods of testing MEMS devices.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features as applied to various embodiments, various omissions, substitutions, and changes in the form and details of the device of process illustrated may be made. Some forms that do not provide all of the features and benefits set forth herein may be made, and some features may be used or practiced separately from others.

What is claimed is:

1. A method of characterizing the behavior of a microelectromechanical system (MEMS) device, the method comprising:
applying a first sinusoidal voltage signal to the MEMS device, wherein the MEMS device comprises a movable electrode spaced apart from another electrode;
measuring an output signal, wherein the output signal comprises current through the MEMS device during application of the first sinusoidal voltage signal to the MEMS device;
identifying frequency components of the output signal;
determining whether the frequency components of the output signal are indicative of non-linear behavior of the MEMS device; and
identifying a transition voltage of the MEMS device based upon the presence of non-linear behavior, wherein identifying a transition voltage of the MEMS device comprises applying at least a second sinusoidal voltage signal to the MEMS device, wherein the second sinusoidal voltage spans a voltage range different from the voltage range of the first sinusoidal voltage.

2. A method of characterizing the behavior of a microelectromechanical system (MEMS) device, the method comprising:
applying a first sinusoidal voltage signal to the MEMS device, wherein the MEMS device comprises a movable electrode spaced apart from another electrode;
applying a second sinusoidal voltage signal to the MEMS device, wherein the second sinusoidal voltage spans a voltage range different from the voltage range of the first sinusoidal voltage
measuring an output signal, wherein the output signal comprises current through the MEMS device during application of at least one of the first sinusoidal voltage signal or the second sinusoidal voltage signal to the MEMS device;
identifying frequency components of the output signal; and
determining whether the frequency components of the output signal are indicative of non-linear behavior of the MEMS device.

3. The method of claim 2, additionally comprising identifying a transition voltage of the MEMS device.

4. A method of characterizing the behavior of a microelectromechanical system (MEMS) device, the method comprising:
applying a first sinusoidal voltage signal to the MEMS device, wherein the MEMS device comprises a movable electrode spaced apart from another electrode;
measuring an output signal, wherein the output signal comprises current through the MEMS device during application of the first sinusoidal voltage signal to the MEMS device;
identifying frequency components of the output signal; and
determining whether the range of the sinusoidal voltage signal comprises a transition voltage based upon the frequency components of the measured output signal in response to the application of said sinusoidal voltage signal.

5. The method of claim 4, wherein the output signal includes current through the MEMS device.

6. The method of claim 4, additionally comprising applying at least a second sinusoidal voltage signal to the MEMS device, wherein the second sinusoidal voltage spans a voltage range different from the voltage range of the first sinusoidal voltage.

7. The method of claim 4, wherein identifying the frequency components of the output signal comprises performing a Fourier transform of the output signal.

8. The method of claim 4, wherein the MEMS device includes an interferometric modulator.

* * * * *